(12) United States Patent
Childress et al.

(10) Patent No.: US 7,765,675 B2
(45) Date of Patent: Aug. 3, 2010

(54) CPP READ SENSORS HAVING CONSTRAINED CURRENT PATHS MADE OF LITHOGRAPHICALLY-DEFINED CONDUCTIVE VIAS AND METHODS OF MAKING THE SAME

(75) Inventors: Jeffrey Robinson Childress, San Jose, CA (US); Jordan Asher Katine, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 598 days.

(21) Appl. No.: 11/219,108

(22) Filed: Sep. 1, 2005

(65) Prior Publication Data

US 2007/0047154 A1    Mar. 1, 2007

(51) Int. Cl.
   G11B 5/187     (2006.01)
   B44C 1/22      (2006.01)
(52) U.S. Cl. .................... 29/603.07; 29/603.12; 216/94; 360/314; 360/322
(58) Field of Classification Search ............... 29/603.07, 29/603.12, 846; 216/66, 94; 360/314, 322, 360/324.2, 327.24, 327.33
See application file for complete search history.

(56) References Cited

U.S. PATENT DOCUMENTS 4,289,845 A * 9/1981 Bowden et al. ........... 216/66 X (Continued)

FOREIGN PATENT DOCUMENTS

JP   08138213 A  *  5/1996

(Continued)

OTHER PUBLICATIONS

U.S. Patent Application Entitled "System, Method, and Apparatus for Linear Array of Current Perpendicular to the Plane Apertures for Lap Control", U.S. Appl. No. 11/229,930, filed Sep. 19, 2005.

(Continued)

Primary Examiner—A. Dexter Tugbang
(74) Attorney, Agent, or Firm—John J. Oskorep, Esq.; Rambod Wader

(57) ABSTRACT

Current-perpendicular-to-plane (CPP) read sensors for magnetic heads having constrained current paths made of lithographically-defined conductive vias, and methods of making the same, are disclosed. In one example, a sensor stack structure which includes an electrically conductive spacer layer is formed over a first shield layer. An insulator layer is deposited over and adjacent the spacer layer, and a resist structure which exposes one or more portions of the insulator layer is formed over the insulator layer. With the resist structure in place, the exposed insulator layer portions are removed by etching to form one or more apertures through the insulator layer down to the spacer layer. Electrically conductive materials are subsequently deposited within the one or more apertures to form one or more lithographically-defined conductive vias of a current-constraining structure.

11 Claims, 18 Drawing Sheets

U.S. PATENT DOCUMENTS

| | | | |
|---|---|---|---|
| 5,491,600 A * | 2/1996 | Chen et al. | 360/322 |
| 5,729,410 A * | 3/1998 | Fontana et al. | 360/324.2 |
| 5,818,323 A | 10/1998 | Maeda et al. | |
| 6,101,072 A | 8/2000 | Hayashi | |
| 6,118,638 A * | 9/2000 | Knapp et al. | 360/314 |
| 6,208,490 B1 | 3/2001 | Lee | |
| 6,330,136 B1 * | 12/2001 | Wang et al. | 360/324.2 |
| 6,504,690 B2 * | 1/2003 | Komuro et al. | 360/324.2 |
| 6,636,389 B2 | 10/2003 | Gill | |
| 6,687,977 B2 | 2/2004 | Knapp et al. | |
| 6,707,649 B2 | 3/2004 | Hasegawa et al. | |
| 6,717,777 B2 | 4/2004 | Den et al. | |
| 6,775,109 B2 | 8/2004 | Gambino et al. | |
| 2004/0184197 A1 | 9/2004 | Zheng et al. | |

OTHER PUBLICATIONS

Chinese Office Action—Patent Application No. 2006101280626.

* cited by examiner

CPP READ SENSORS HAVING CONSTRAINED CURRENT PATHS MADE OF LITHOGRAPHICALLY-DEFINED CONDUCTIVE VIAS AND METHODS OF MAKING THE SAME

BACKGROUND

1. Field of the Technology

The present application relates generally to read sensors of magnetic heads in data storage devices, and more particularly to read sensors of the current-perpendicular-to-plane (CPP) type.

2. Description of the Related Art

Computers often include auxiliary memory storage devices having media on which data can be written and from which data can be read for later use. A direct access storage device (disk drive) incorporating rotating magnetic disks are commonly used for storing data in magnetic form on the disk surfaces. Data is recorded on concentric, radially spaced tracks on the disk surfaces. Magnetic heads which include read sensors are then used to read data from the tracks on the disk surfaces.

In high capacity disk drives, magnetoresistive (MR) read sensors, commonly referred to as MR heads, may be used to read data from a surface of a disk at greater linear densities than thin film inductive heads. An MR sensor detects a magnetic field through the change in the resistance of its MR sensing layer (also referred to as an "MR element") as a function of the strength and direction of the magnetic flux being sensed by the MR layer. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage. Within the general category of MR sensors is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers. GMR sensors using only two layers of ferromagnetic material (e.g. nickel-iron, cobalt-iron, or nickel-iron-cobalt) separated by a layer of nonmagnetic material (e.g. copper) are generally referred to as spin valve (SV) sensors manifesting the SV effect.

One of the ferromagnetic (FM) layers referred to as the pinned layer has its magnetization typically pinned by exchange coupling with an antiferromagnetic (AFM) layer (e.g., nickel-oxide, iron-manganese, or platinum-manganese). The pinning field generated by the AFM pinning layer should be greater than demagnetizing fields to ensure that the magnetization direction of the pinned layer remains fixed during application of external fields (e.g. fields from bits recorded on the disk). The magnetization of the other FM layer referred to as the free layer, however, is not fixed and is free to rotate in response to the field from the information recorded on the magnetic medium (the signal field). The pinned layer may be part of an antiparallel (AP) pinned structure which includes an antiparallel coupling (APC) layer formed between first and second AP pinned layers. The first AP pinned layer, for example, may be the layer that is exchange coupled to and pinned by the AFM pinning layer. By strong antiparallel coupling between the first and second AP pinned layers, the magnetic moment of the second AP pinned layer is made antiparallel to the magnetic moment of the first AP pinned layer.

Sensors are classified as a bottom sensor or a top sensor depending upon whether the pinned layer is located near the bottom of the sensor close to the first read gap layer or near the top of the sensor close to the second read gap layer. Sensors are further classified as simple pinned or AP pinned depending upon whether the pinned structure is one or more FM layers with a unidirectional magnetic moment or a pair of AP pinned layers separated by the APC layer with magnetic moments of the AP pinned layers being antiparallel. Sensors are still further classified as single or dual wherein a single sensor employs only one pinned layer and a dual sensor employs two pinned layers with the free layer structure located there between.

A read sensor may also be of a current-perpendicular-to-planes (CPP) type in which current flows perpendicular to the major planes of the sensor layers. First and second shield layers engage the bottom and the top, respectively, of the sensor so as to simultaneously serve as electrically conductive leads for the sensor. The CPP sensor may be contrasted with a current-in-plane (CIP) type sensor in which the current is conducted in planes parallel to the major thin film planes of the sensor. In a CPP sensor, when the spacer layer between the free layer and the AP pinned structure is nonmagnetic and electrically conductive (such as copper), the current is referred to as a "sense current"; however when the spacer layer is nonmagnetic and electrically nonconductive (such as aluminum oxide), the current is referred to as a "tunneling current". Hereinafter, the current is referred to as a perpendicular current $I_p$ which can be either a sense current or a tunneling current.

All conventional metallic CPP read sensors have several shortcomings. First, their resistance-area (RA) products are quite low. For typical sensor areas, this results in read sensors having low resistance values which are poorly matched to amplifiers of the read circuitry. In addition, parasitic resistances from layers of the read sensor that do not contribute to the magnetoresistance (e.g. the AFM layers) lower the signal-to-noise ratio (SNR) of the sensor. Finally, unlike magnetic tunneling junction (MTJ) CPP sensors using the current $I_p$ as a tunneling current, the relatively low resistance of all metallic CPP sensors requires them to operate at very high current densities. However, effects such as the spin torque phenomenon and the Oersted field from the perpendicular current $I_p$ limit current densities suitable for stable sensor operation.

Current densities of CPP read sensors may be increased by restricting the flow of the perpendicular current $I_p$ through the sensor stack. Conventionally, this may be achieved by utilizing "current-screen" layers which are created by placing one or more ultra-thin insulating layers (a nano-oxide layer or NOL) within the sensor. Many tiny randomly-distributed conductive pores or holes, which restrict the current flow and concentrate the current density near the active layers of the sensor, are created through this process. In practice, however, the process is difficult to control and does not achieve adequate and manufacturable results. As sensors become smaller, the sensor covers such a small region of the film that statistical variations in the distribution of conductive pores, and therefore in the current density may cause uncontrollable and unacceptable variations in the sensor resistance.

Accordingly, there is an existing need to overcome these and other deficiencies of the prior art.

SUMMARY

Current-perpendicular-to-planes (CPP) read sensors having constrained current paths made of lithographically-defined conductive vias, and methods of making the same, are disclosed. In one illustrative example, at least part of a sensor stack structure which includes an electrically conductive spacer layer is formed over a first shield layer. An insulator layer is deposited over and adjacent the spacer layer, and a resist structure which exposes one or more portions of the insulator layer is formed over the insulator layer. With the resist structure in place, the one or more exposed insulator portions are removed by etching to form one or more apertures through the insulator layer down to the spacer layer. Electrically conductive materials are subsequently deposited within the one or more apertures to form one or more lithographically-defined conductive vias of a current-constraining structure. Advantageously, such lithographically-defined conductive vias increase the current density of the read sensor in the region of the sensing layers to thereby simultaneously increase its resistance and magnetoresistance. The size and number of vias may be varied and selected so as to precisely "tune" the sensor's resistance and magnetoresistance.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION OF THE PREFERRED EMBODIMENTS

Current-perpendicular-to-planes (CPP) read sensors having constrained current paths made of lithographically-defined conductive vias, and methods of making the same, are disclosed. In one illustrative example, at least part of a sensor stack structure is formed over a first shield layer. An insulator layer is deposited over and adjacent at least part of a capping layer structure of the sensor stack structure, and a resist structure which exposes one or more portions of the insulator layer is formed over the insulator layer. With the resist structure in place, the one or more exposed insulator portions are removed by etching to form one or more apertures through the insulator layer down to the capping layer structure. Electrically conductive materials are subsequently deposited within the one or more apertures to form one or more lithographically-defined conductive vias of a current-constraining structure which forms a top of the sensor stack structure. Advantageously, such lithographically-defined conductive vias increase the current density of the read sensor in the region of the sensing layers to thereby simultaneously increase its resistance and magnetoresistance. The size and number of vias may be varied and selected so as to precisely "tune" the sensor's resistance and magnetoresistance. As there is increasing evidence that the magnetoresistive effect is reduced near edges of the read sensor from milling damage, it is also advantageous to isolate a single or few vias in the center of the sensor structure to avoid such damage.

The following description is the best embodiment presently contemplated for carrying out the present invention. This description is made for the purpose of illustrating the general principles of the present invention and is not meant to limit the inventive concepts claimed herein.

Figure 1:
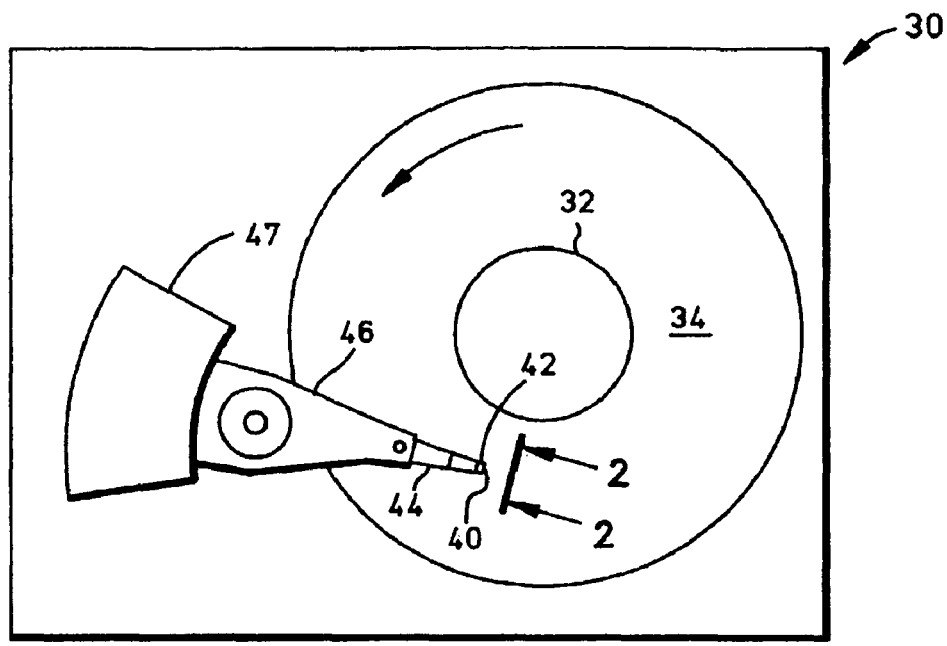
FIG. 1 is a plan view of an exemplary prior art magnetic disk drive.
Figure 2:
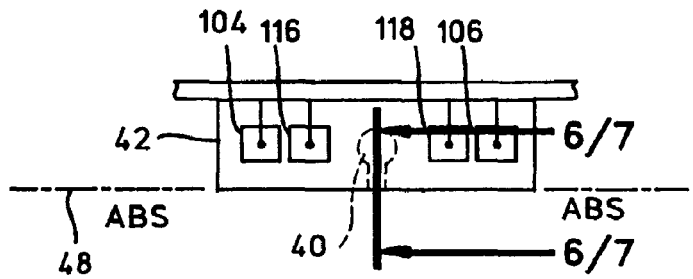
FIG. 2 is an end view of a slider with a magnetic head of the disk drive as seen in plane 2-2 of FIG. 1.
Figure 3:
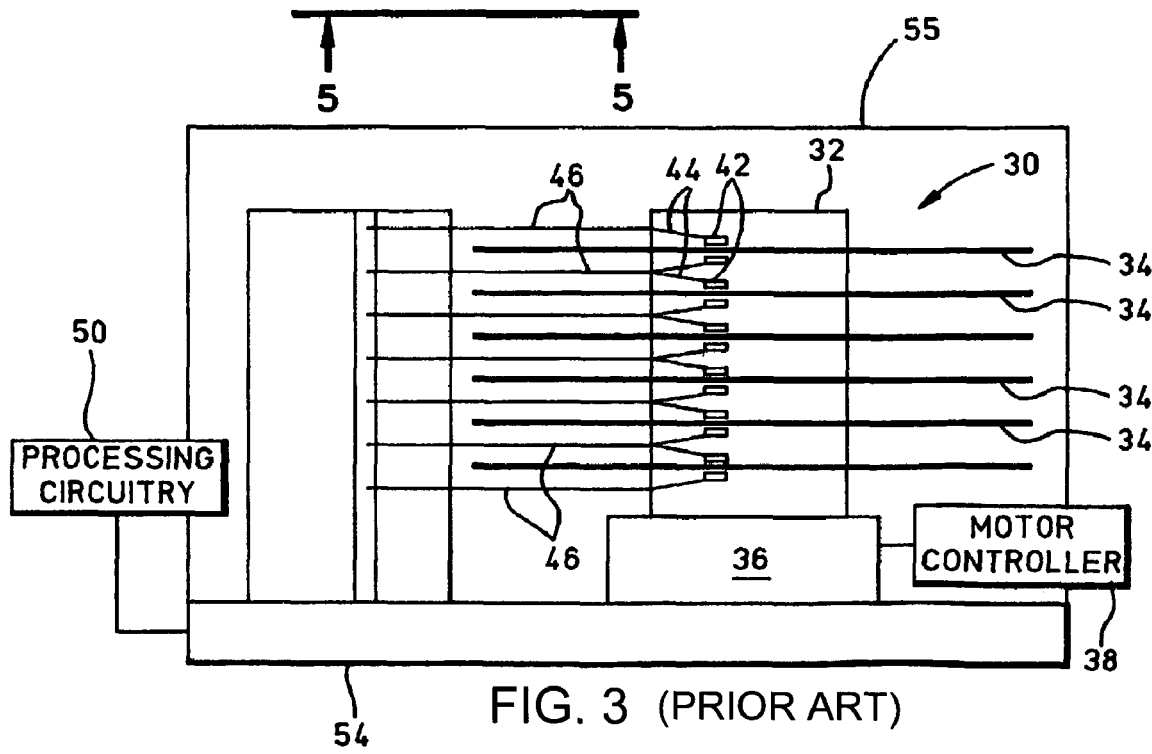
FIG. 3 is an elevation view of the magnetic disk drive wherein multiple disks and magnetic heads are employed.
Figure 4:
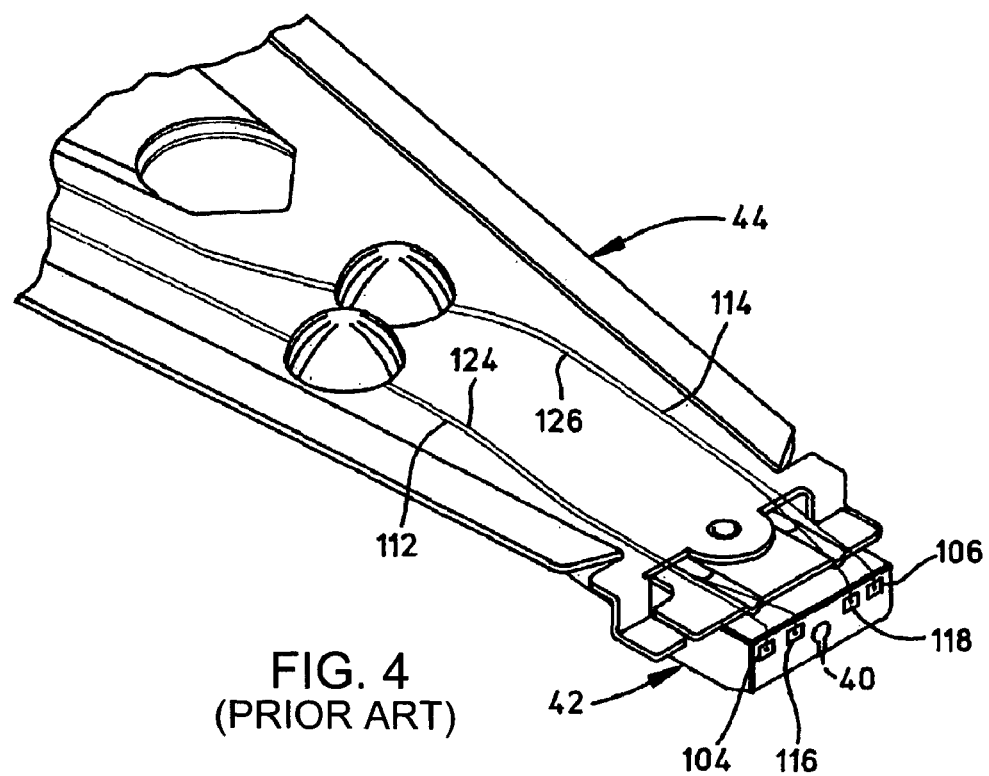
FIG. 4 is an isometric illustration of an exemplary prior art suspension system for supporting the slider and magnetic head.
Figure 5:
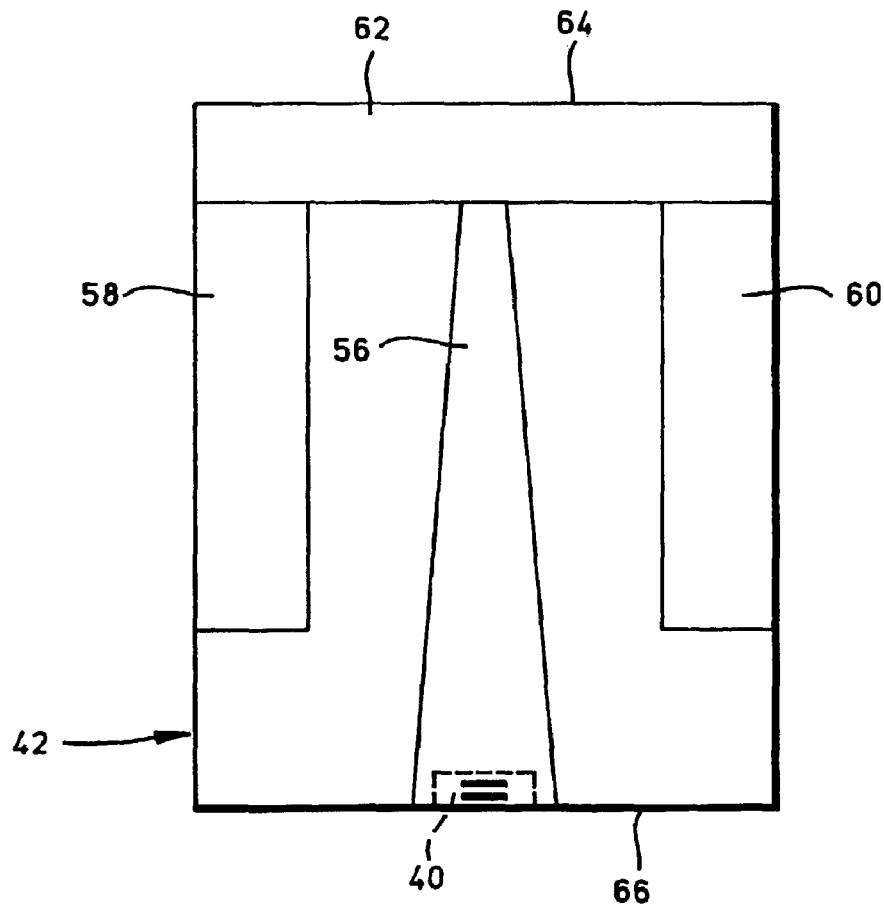
FIG. 5 is an ABS view of the magnetic head taken along plane 5-5 of FIG. 2.

Referring now to the drawings wherein like reference numerals designate like or similar parts throughout the several views, FIGS. 1-3 illustrate a magnetic disk drive 30. Disk drive 30 includes a spindle 32 that supports and rotates a magnetic disk 34. Spindle 32 is rotated by a spindle motor 36 that is controlled by a motor controller 38. A slider 42 includes a combined read and write magnetic head 40 and is supported by a suspension 44 and actuator arm 46 that is rotatably positioned by an actuator 47. Magnetic head 40 may utilize the read sensor which is made in accordance with the present invention. A plurality of disks, sliders, and suspensions may be employed in a large capacity direct access storage device (DASD) as shown in FIG. 3. Suspension 44 and actuator arm 46 are moved by actuator 47 to position slider 42 so that magnetic head 40 is in a transducing relationship with a surface of magnetic disk 34. When disk 34 is rotated by spindle motor 36, slider 42 is supported on a thin (typically, 0.05 μm) cushion of air (air bearing) between the surface of disk 34 and an air bearing surface (ABS) 48. Magnetic head 40 may then be employed for writing information to multiple circular tracks on the surface of disk 34, as well as for reading information therefrom. Processing circuitry 50 exchanges signals, representing such information, with head 40, provides spindle motor drive signals for rotating magnetic disk 34, and provides control signals to actuator 47 for moving slider 42 to various tracks. In FIG. 4, slider 42 is shown mounted to a suspension 44. The components described hereinabove may be mounted on a frame 54 of a housing 55, as shown in FIG. 3. FIG. 5 is an ABS view of slider 42 and magnetic head 40. Slider 42 has a center rail 56 that supports magnetic head 40, and side rails 58 and 60. Rails 56, 58 and 60 extend from a cross rail 62. With respect to rotation of magnetic disk 34, cross rail 62 is at a leading edge 64 of slider 42 and magnetic head 40 is at a trailing edge 66 of slider 42.

Figure 6:
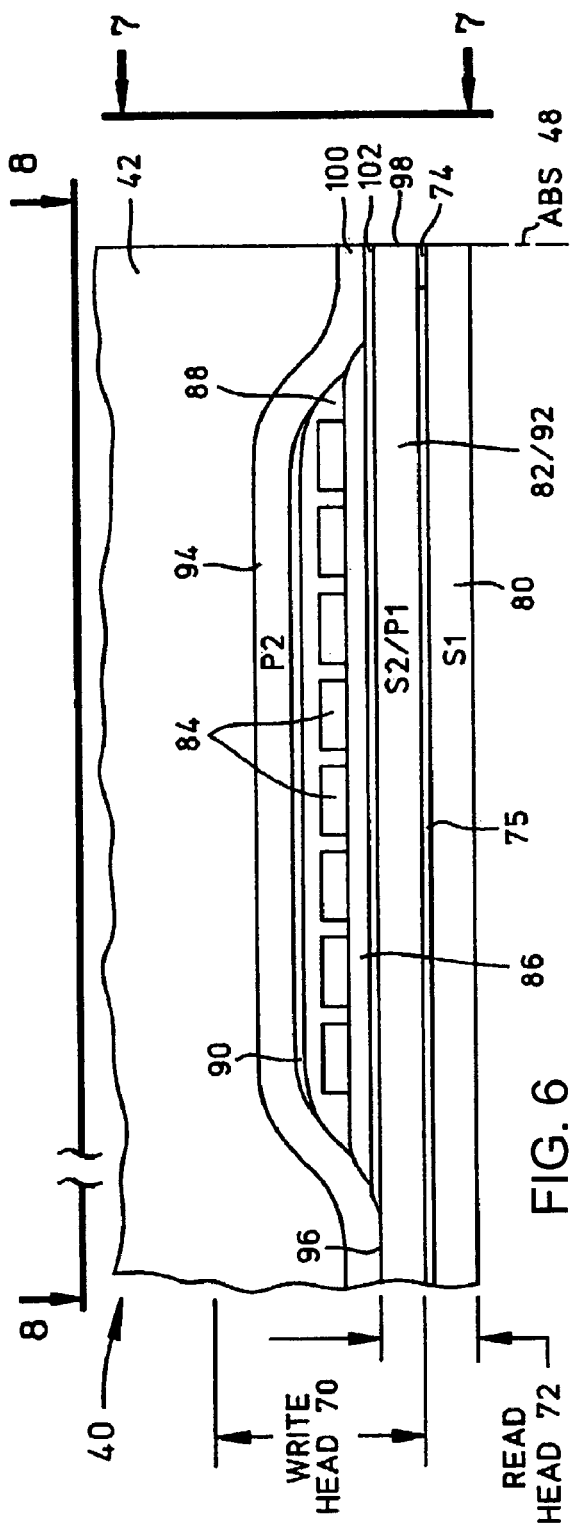
FIG. 6 is a partial view of the slider and a merged magnetic head as seen in plane 6-6 of FIG. 2.
Figure 7:
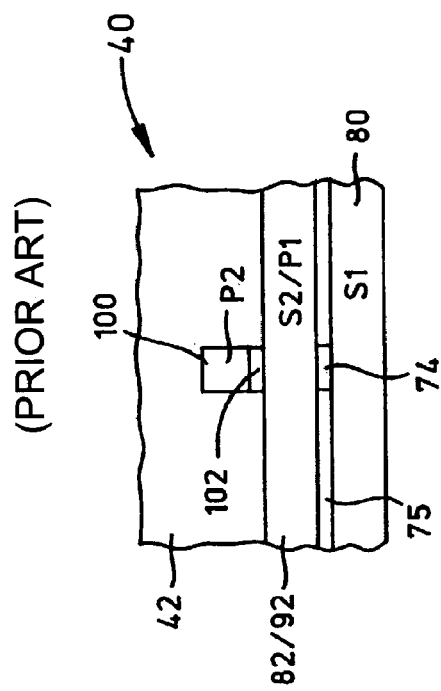
FIG. 7 is a partial ABS view of the slider taken along plane 7-7 of FIG. 6 to show the read and write elements of the magnetic head.

FIG. 6 is a side cross-sectional elevation view of a merged magnetic head 40, which includes a write head portion 70 and a read head portion 72. Read head portion 72 includes a CPP giant magnetoresistive (GMR) read head which utilizes a CPP sensor 74. FIG. 7 is an ABS view of FIG. 6. CPP sensor 74 is sandwiched between ferromagnetic first and second shield layers 80 and 82. In response to external magnetic fields, the resistance of CPP sensor 74 changes. A sense current $I_s$ conducted through the sensor causes these resistance changes to be manifested as potential changes. These potential changes are then processed as readback signals by processing circuitry 50 shown in FIG. 3.

Figure 8:
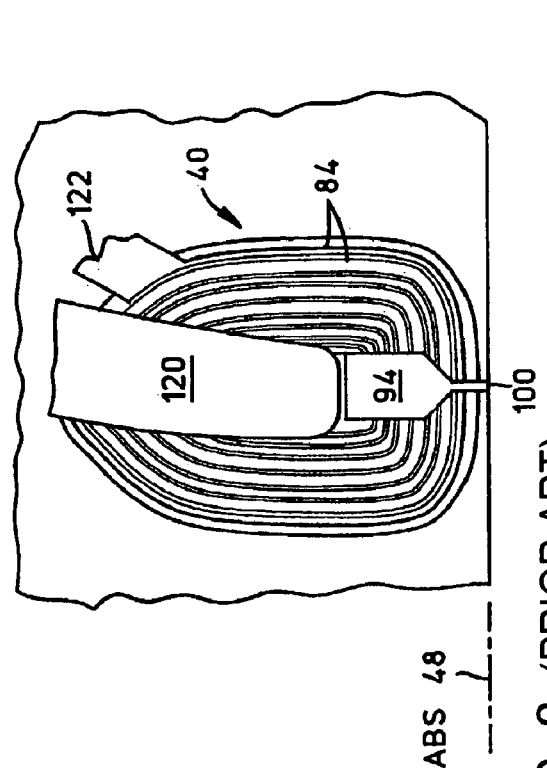
FIG. 8 is a view taken along plane 8-8 of FIG. 6 with all material above the coil layer and leads removed.

Write head portion 70 of magnetic head 40 includes a coil layer 84 sandwiched between first and second insulation layers 86 and 88. A third insulation layer 90 may be employed for planarizing the head to eliminate ripples in the second insulation layer caused by coil layer 84. The first, second and third insulation layers are referred to in the art as an "insulation stack". Coil layer 84 and first, second and third insulation layers 86, 88 and 90 are sandwiched between first and second pole piece layers 92 and 94. First and second pole piece layers 92 and 94 are magnetically coupled at a back gap 96 and have first and second pole tips 98 and 100 which are separated by a write gap layer 102 at the ABS. Since second shield layer 82 and first pole piece layer 92 are a common layer, this head is known as a merged head. In a piggyback head an insulation layer is located between a second shield layer and a first pole piece layer. As shown in FIGS. 2 and 4, first and second solder connections 104 and 106 connect leads from spin valve sensor 74 to leads 112 and 114 on suspension 44, and third and fourth solder connections 116 and 118 connect leads 120 and 122 from the coil 84 (see FIG. 8) to leads 124 and 126 on suspension 44.

Figure 9:
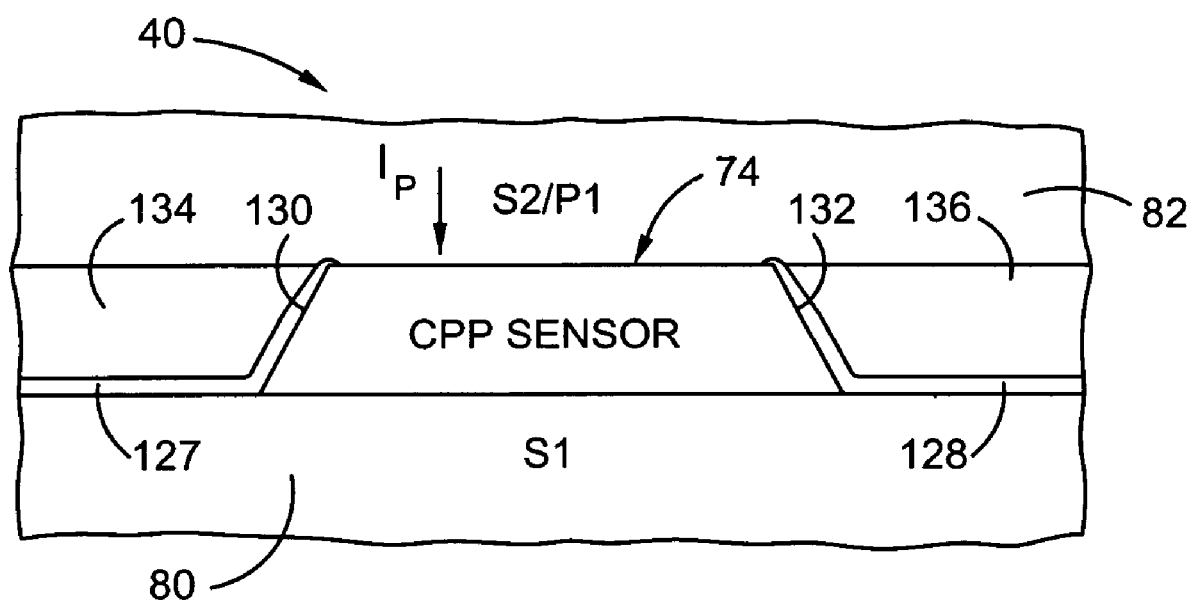
FIG. 9 is an enlarged isometric ABS illustration of a magnetic head having a current-perpendicular-to-the-planes (CPP) type sensor.

FIG. 9 is an enlarged ABS illustration of the prior art read head portion shown in FIG. 7. The read head includes the CPP sensor 74. First and second insulation layers 127 and 128, such as alumina, cover the first shield layer 80 on each side of the sensor 74 as well as slightly covering first and second sidewalls 130 and 132 of the sensor. First and second hard bias layers (HB) 134 and 136 are on the insulation layers 127 and 128 and are adjacent the side walls 130 and 132. Metallic seed layers (not shown in FIG. 9) are formed between insulator layers 127 and 128 and hard bias layers 134 and 136. The hard bias layers 134 and 136 cause magnetic fields to extend longitudinally through the sensor 74 for stabilizing the free layer. The sensor 74 and the first and second hard bias layers 134 and 136 are located between ferromagnetic first and second shield layers 80 and 82 which may serve as leads for conducting the perpendicular current $I_p$ through the sensor 74.

Figure 10:
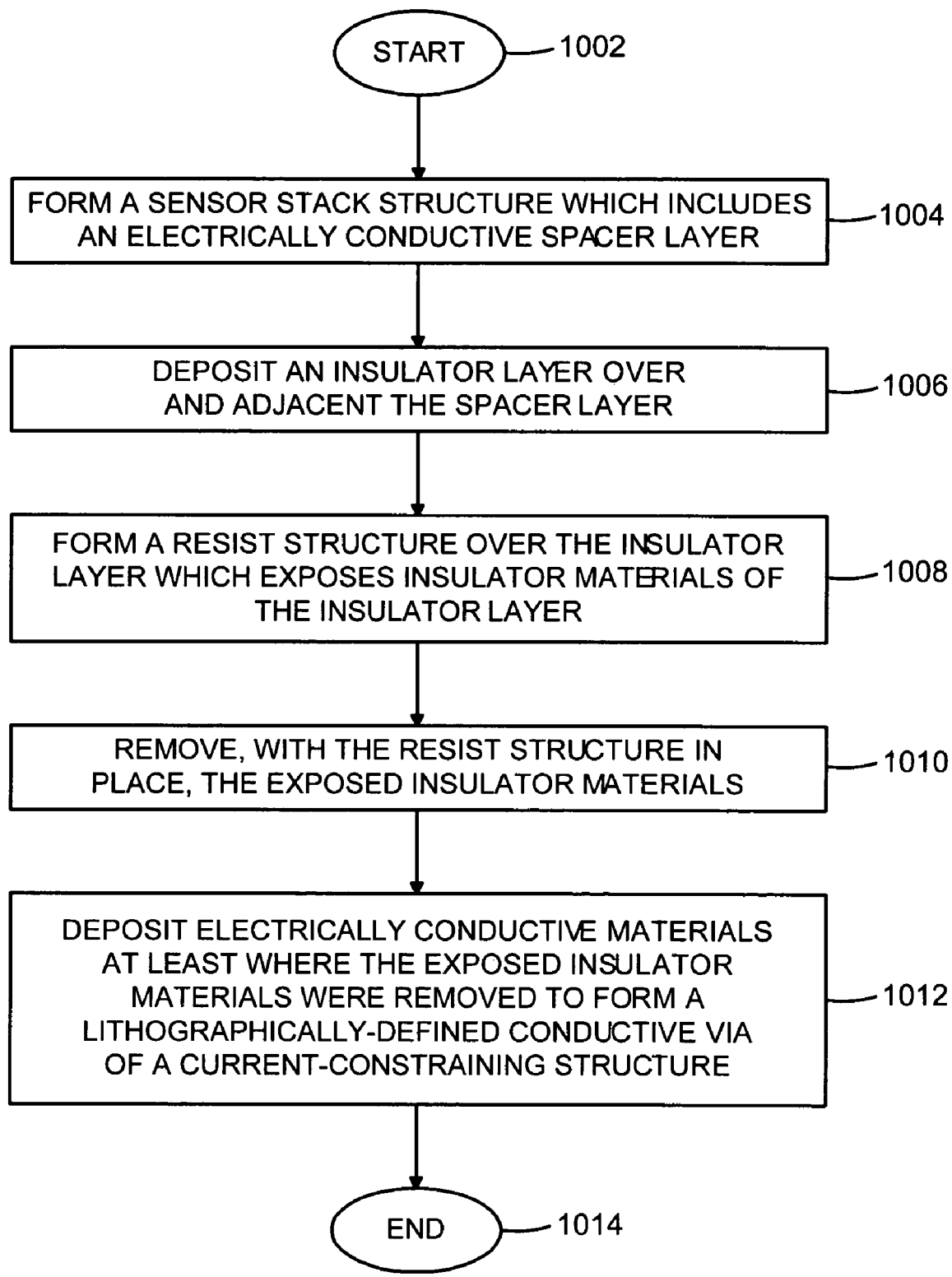
FIG. 10 is a flowchart which describes a fabrication process for a CPP sensor having constrained current paths made of lithographically-defined conductive vias.

FIG. 10 is a flowchart which describes a fabrication process for an exemplary CPP read sensor having a current-constraining structure made of one or more lithographically-defined conductive vias. FIGS. 11-15, which are a series of ABS illustrations showing partially-fabricated sensor structures corresponding to the steps described in the flowchart of FIG. 10, will be referred to in combination with the flowchart steps of FIG. 10.

Figure 11:
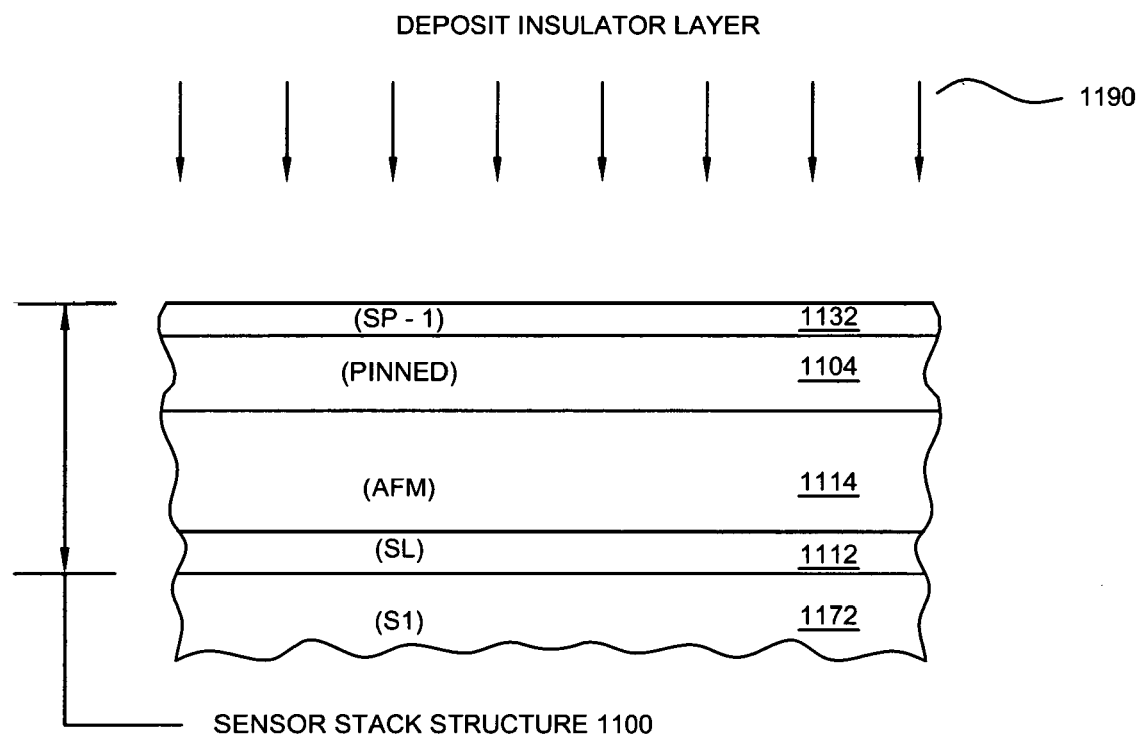
FIG. 11 is the first in a series of ABS illustrations of FIGS. 11-15 of partially fabricated sensor structures corresponding to the steps described in the flowchart of FIG. 10, showing that a read sensor stack structure which includes an electrically conductive spacer layer is formed over a first shield layer.

Beginning at a start block 1002 of FIG. 10 in combination with FIG. 11, at least a portion of a CPP sensor stack structure 1100 having an electrically conductive spacer layer portion (SP-1) 1132 is formed over a first shield layer (S1) 1172 (step 1004 of FIG. 10). CPP sensor stack structure 1100 may be made of any suitable sensor materials and, in this embodiment, includes (from bottom to top) a seed layer (SL) 1112, an antiferromagnetic (AFM) pinning layer 1114, a pinned layer structure 1104, and spacer layer portion (SP-1) 1132. In this "top-SV" exemplary configuration, pinned layer structure 1104 is formed beneath and adjacent spacer layer portion 1132 and over and adjacent AFM pinning layer 1114. AFM pinning layer 1114 is formed beneath and adjacent pinned layer structure 1104 and over and adjacent to seed layer 1112. Seed layer 1112 is formed over and adjacent first shield layer 1172 and underneath AFM pinning layer 1114 for promoting an improved texture of the layers deposited thereon. In this embodiment, spacer layer portion 1132 will form only a bottom portion or bottom sublayer (SP-1) of the entire spacer layer structure of the resulting CPP read sensor. Spacer layer portion 1132 is highly-conductive and non-magnetic, and may be made of suitable materials such as copper (Cu) or gold (Au).

Figure 12:
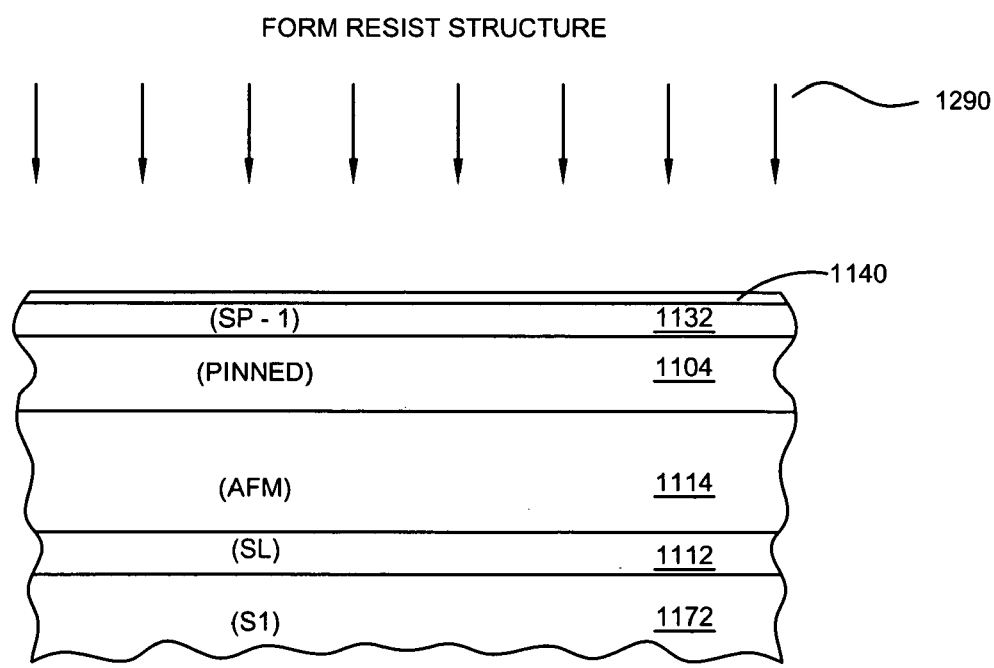
FIG. 12 is the second in a series of ABS illustrations of FIGS. 11-15 of partially fabricated sensor structures corresponding to the steps described in the flowchart of FIG. 10, which is the same as that shown in FIG. 11 except that an insulator layer is formed over the spacer layer.

A deposition process 1190 is utilized to deposit insulator materials over and adjacent spacer layer portion 1132 (step 1006 of FIG. 10). The result is shown in FIG. 12, where an insulator layer 1140 is formed in contact with spacer layer portion 1132. Insulator layer 1140 may be made from any suitable electrically insulating material, such as alumina ($Al_2O_3$), or other insulator materials such as silicon-oxide ($SiO_2$), silicon-nitride ($Si_3N_4$), Magnesium oxide (MgO), or tantalum-oxide ($Ta_2O_5$). Since it will form part of the spacer layer structure, insulator layer 1140 is formed with a very small thickness such as between 10 Angstroms (Å) and 100 Å.

Figure 13:
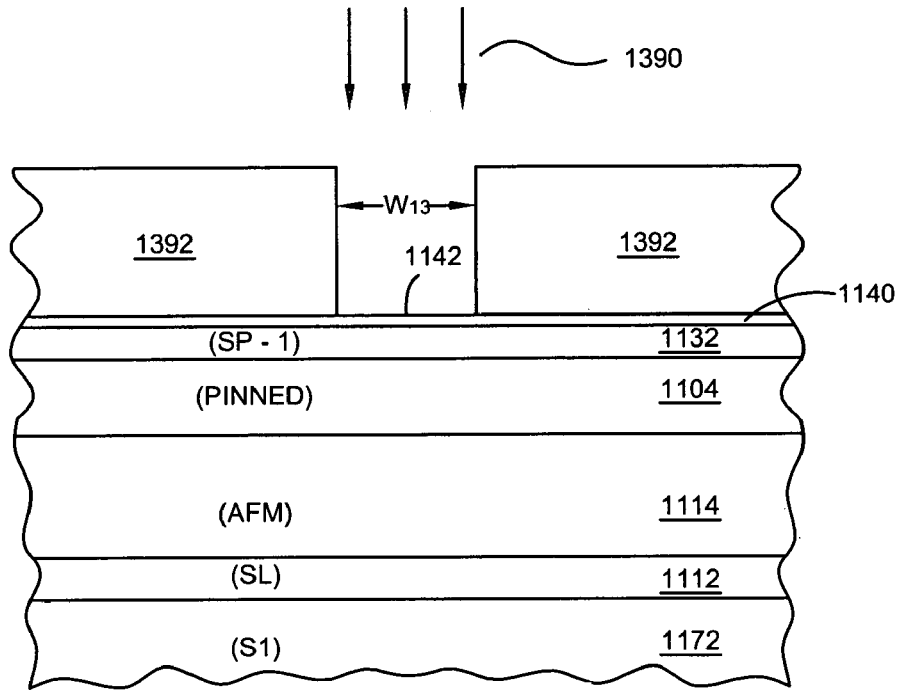
FIG. 13 is the third in a series of ABS illustrations of FIGS. 11-15 of partially fabricated sensor structures corresponding to the steps described in the flowchart of FIG. 10, which is the same as that shown in FIG. 12 except a resist structure is applied and patterned on top of the insulator layer exposing insulator materials of the insulator layer.

A resist structure formation process 1290 is then performed, where in FIG. 13 a resist structure 1392 is applied and patterned over and adjacent insulator layer 1140 exposing insulator materials 1142 of insulator layer 1140 (step 1008 of FIG. 10). Resist structure 1392 may be made from a photoresist. Alternatively, resist structure 1392 may be made from a resist which is compatible with electron beam (e-beam) lithography processes. Although resist structure 1392 is shown and described as a monolayer resist, it may alternatively be a multi-layered resist (e.g. bilayer or trilayer resist). As shown, resist structure 1392 is formed to define an opening having an appropriate width $W_{13}$ for a subsequently-formed lithographically-defined conductive via. If photolithography is used to form resist structure 1392, a thin film of resist is light-exposed in regions which are to be removed, provided the resist is a positive resist. If the resist is a negative resist, it is light-exposed in regions that are to be retained. Finally, the resist is subjected to a basic developer solution. If electron beam (e-beam) lithography is used to form resist structure 1392, a thin film of resist is e-beam-exposed in regions which are to be removed, provided the resist is a positive resist. If the resist is a negative resist, it is light-exposed in regions that are to be retained. Finally, the resist is subjected to a suitable developer solution. Width $W_{13}$, which will ultimately determine the width of the resulting conductive via, may be within 3 and 40 nanometers (nm). In this embodiment, only a single opening is formed within a center of resist structure 1392 (which is at a centerline of the width of sensor stack structure 1100 and the trackwidth of the resulting read sensor). However, the number of openings will vary depending on the number of vias desired.

Figure 14:
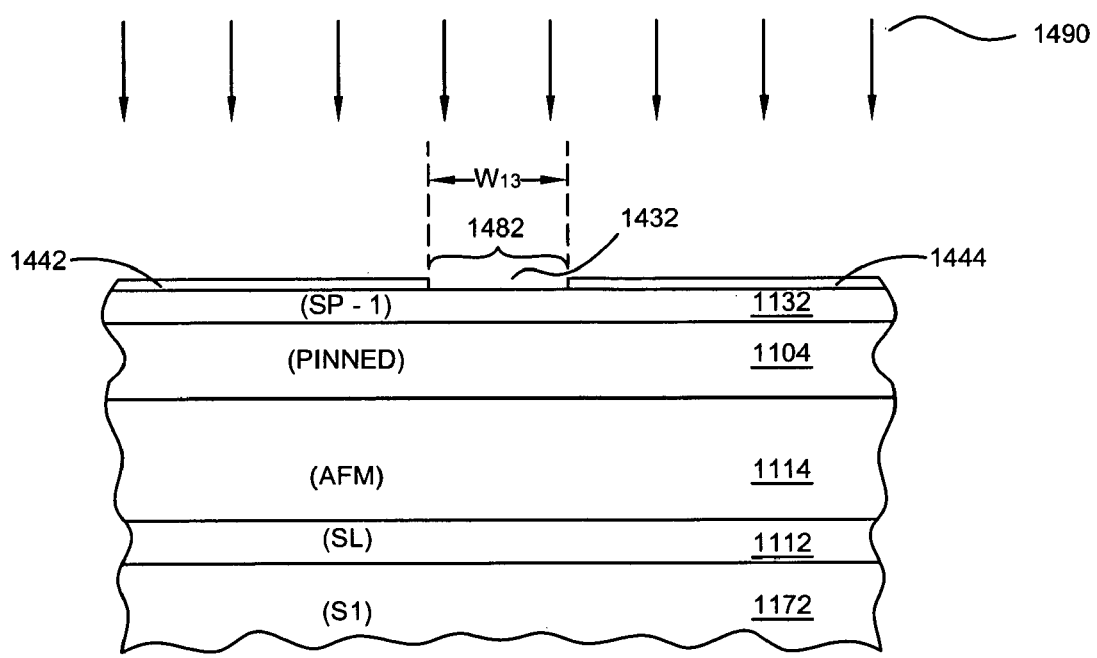
FIG. 14 is the fourth in a series of ABS illustrations of FIGS. 11-15 of partially fabricated sensor structures corresponding to the steps described in the flowchart of FIG. 10, which is the same as that shown in FIG. 13 except that the exposed insulator materials are removed and a via is formed through the insulator layer.

With resist structure 1392 in place, an etching process 1390 (e.g. ion milling) is utilized to remove exposed insulator materials 1142 through the opening of resist structure 1392 (step 1010 of FIG. 10). The result is shown in FIG. 14, where an aperture 1482 is formed down to the top of spacer layer portion 1132 to expose electrically conductive materials 1432 thereof. If the etching is performed along the entire stripe height (SH) dimension, the insulator layer may be completely separated into first and second insulator layer portions 1442 and 1444. The ion milling process is discontinued once the top of spacer layer portion 1132 is reached, where electrically conductive materials 1432 of spacer layer portion 1132 are exposed. Thus, aperture 1482 is formed down through the entire insulator layer, is surrounded by insulator layer portions 1442 and 1444, and has substantially the same width $W_{13}$ as the opening of the resist structure. FIG. 14 also reveals that the resist structure may be removed at this time using a suitable solvent or other suitable technique.

Figure 15:
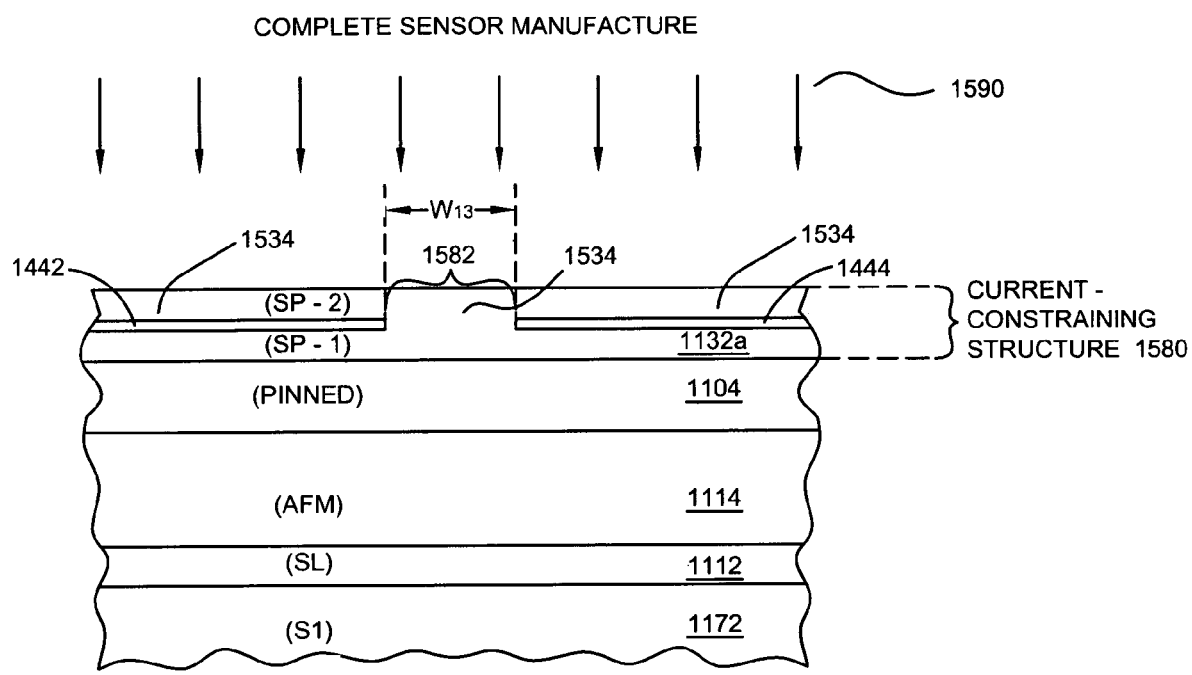
FIG. 15 is the fifth in a series of ABS illustrations of FIGS. 11-15 of partially fabricated sensor structures corresponding to the steps described in the flowchart of FIG. 10, which is the same as that shown in FIG. 14 except electrically conductive materials are formed within the via and over the insulator layer to thereby form a current-constraining structure having a lithographically-defined conductive via.

A deposition process 1490 is then performed to deposit electrically conductive materials within aperture 1482 over exposed electrically conductive materials 1432 (step 1012 of FIG. 10). The result is shown in FIG. 15, where electrically conductive materials 1534 are not only formed within aperture 1482 but also over insulator layer portions 1442 and 1444. As a result, a lithographically-defined conductive via 1582 of a current-constraining structure 1580 is formed. Electrically conductive materials 1534 which are formed above lithographically-defined conductive via 1582 and over insulator portions 1442 and 1444 form a top portion or top sublayer (SP-2) of the entire spacer layer structure. In this embodiment, only a single via is formed within a center of the structure (which is at a centerline of the width of sensor stack structure 1100 and the trackwidth of the resulting read sensor). However, the number of vias will vary depending on the design. Note that deposition process 1490 of FIG. 14 may alternatively be performed with resist structure 1392 kept in place until aperture 1432 is filled with the electrically conductive materials to form a flat top surface with insulator portions 1442 and 1444. After aperture is filled with the electrically conductive materials to form the via, resist structure 1392 is removed and the remaining electrically conductive materials are deposited to form the top sublayer of the spacer layer.

The method corresponding to the steps described in the flowchart of FIG. 10 ends at an end block 1014, but additional processing steps may be subsequently performed. For example, additional manufacturing processes 1590 are utilized to complete the formation of the CPP read sensor, shown in FIG. 16 as a CPP read sensor 1600. These processes 1590 may utilize any suitable techniques known in the art (conventional or otherwise) to complete the manufacturing per the design requirements.

As described, the preferred lithographic process utilized in the method of FIG. 10 included the steps of forming a resist structure over an insulator layer of the sensor stack structure which exposes insulator materials of the insulator layer; etching, with the resist structure in place, the exposed insulator materials to form an aperture through the insulator layer; and forming electrically conductive materials within the aperture to thereby form the lithographically-defined conductive via. As an alternative, however, an electrically conductive layer may be etched and insulator materials may be subsequently deposited around it to form the via. This alternative lithographic process may include the more detailed steps of forming a resist structure over the electrically conductive layer which exposes electrically conductive materials of the electrically conductive layer; etching away, with the resist structure in place, the exposed electrically conductive materials to form openings through the conductive layer; and depositing insulator materials within the openings to surround the lithographically-defined conductive via.

Figure 16:
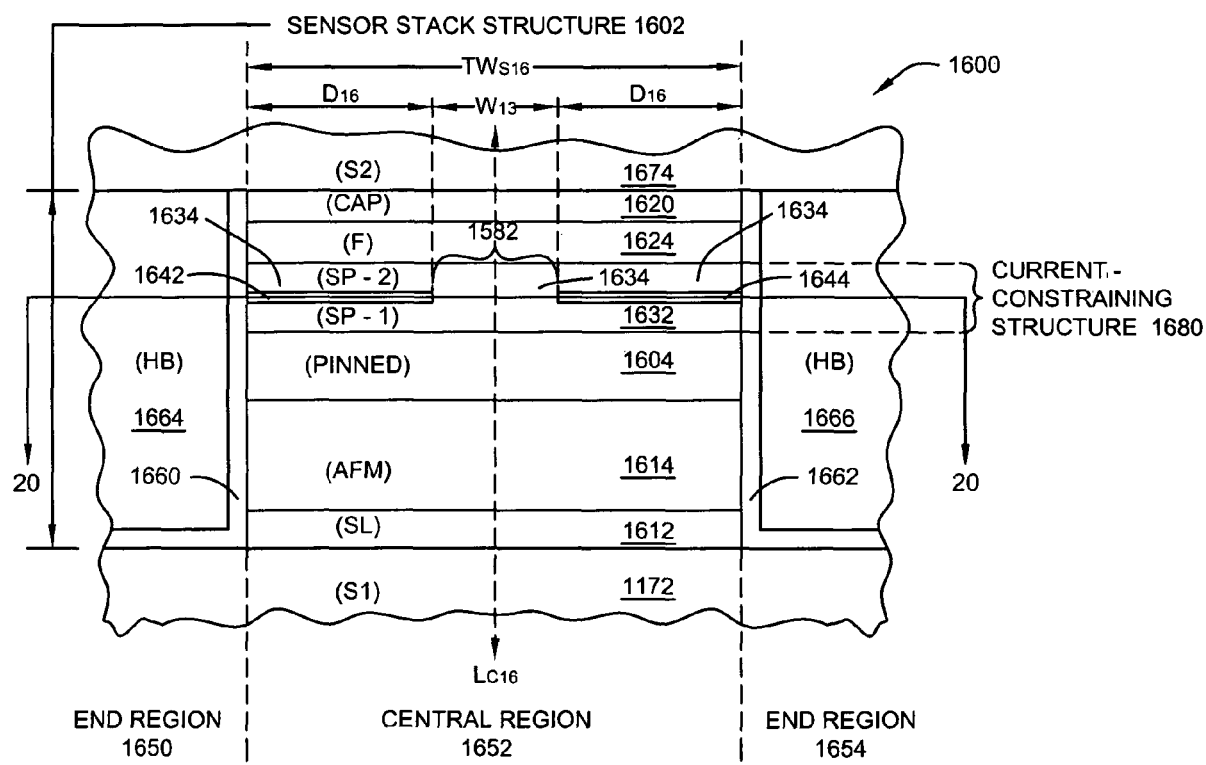
FIG. 16 is an ABS illustration showing a CPP read sensor of an exemplary embodiment of the present application.

As shown in FIG. 16, the resulting CPP read sensor 1600 made from the above-described methods has a sensor stack structure 1602 ("top-SV") formed in a central region 1652 surrounded by end regions 1650 and 1654. Sensor stack structure 1602 includes, from bottom to top, a seed layer 1612, an AFM pinning layer 1614, a pinned layer structure 1604, a current constraining structure 1680, a sensing layer structure (F) 1624 and a capping layer 1620. Capping layer 1620 is formed below and adjacent second shield layer 1674 and over and adjacent sensing layer structure 1624. Sensing layer structure 1624 is formed below and adjacent capping layer 1620 and over and adjacent current-constraining structure 1680. Current-constraining structure 1680 is formed below and adjacent sensing layer structure 1624 and above and adjacent pinned layer structure 1604. Pinned layer structure 1604 is formed below and adjacent current-constraining structure 1680 and over and adjacent AFM pinning layer 1614. AFM pinning layer 1614 is formed below and adjacent pinned layer structure 1604 and over and adjacent seed layer 1620. Seed layer 1612 is formed over and adjacent first shield layer 1172 and below and adjacent AFM pinning layer 1614 for promoting an improved texture of the layers deposited thereon. CPP read sensor 1600 has first and second insulator layers 1660 and 1662 formed in end regions 1650 and 1652 over and adjacent first shield layer 1172, as well as, sidewalls of sensor stack structure 1602. Furthermore, CPP read sensor 1600 has first and second hard bias layers 1664 and 1666 formed over and adjacent insulator layers 1660 and 1662. Finally, second shield layer (S2) 1674 is shown formed over the planarized structure.

Note that, instead of current-constraining structure 1680 being formed within the entire spacer layer, it may be formed on top of or below the spacer layer. In this variation, the lithographically-defined conductive via may be formed from the same or different non-magnetic conductive materials of the spacer layer or from the ferromagnetic materials of the underlying/overlying magnetic layers.

The following materials may be utilized in CPP read sensor 1600. First and second shields 1172 and 1674 may be made of any suitable material such as nickel-iron (NiFe); seed layer 1612 may have one or more layers of any suitable material such as nickel-iron-chromium (NiFeCr) or NiFe; AFM pinning layer structure 1614 may be made of any suitable material, such as platinum manganese (PtMn) or alternatively iridium manganese (IrMn); pinned layer structure 1604 may be made of any suitable material such as cobalt (Co) or cobalt-iron (CoFe); electrically conductive portions 1632 and 1634 of current-constraining structure 1680 may be made of any suitable material such as copper (Cu) or gold (Au), while insulating portions 1642 and 1644 of current-constraining structure 1680 may be made of any suitable material such as aluminum oxide ($Al_2O_3$); sensing layer structure 1624 may be made of any suitable material such as CoFe or alternatively NiFe; capping layer 1620 may be made of any suitable material such as tantalum (Ta); first and second insulator layers 1660 and 1662 may be made of any suitable material such as $Al_2O_3$; first and second hard bias layers 1664 and 1666 may be made of any suitable material such as cobalt-platinum-chromium (Co—Pt—Cr) or other Co-based alloy.

The following thicknesses of the various layers may be utilized in CPP read sensor 1600. First and second shields 1172 and 1674 may have a thickness range of about 30 nm to about 500 nm; seed layer 1612 may have a thickness range of about 10 Å to about 100 Å; AFM pinning layer structure 1614 may have a thickness range of about 30 Å to about 300 Å; pinned layer structure 1604 may have a thickness range of about 10 Å to about 100 Å; electrically conductive portions 1632 and 1634 of current-constraining structure 1680 may have a thickness range of about 2 Å to about 10 Å respectively, insulating portions 1642 and 1644 of current-constraining structure 1680 may have a thickness range of about 5 Å to about 100 Å, and lithographically-defined conductive via 1582 may have a thickness range of about 5 Å to about 100 Å; sensing layer structure 1624 may have a thickness range of about 10 Å to about 100 Å; capping layer 1620 may have a thickness range of about 5 Å to about 50 Å; first and second insulator layers 1660 and 1662 may have a thickness range of about 10 Å to about 100 Å; and first and second hard bias layers 1664 and 1666 may have a thickness range of about 20 nm to about 200 nm.

As shown in FIG. 16, current-constraining structure 1680 of this exemplary embodiment is formed as part of or within a spacer layer having a first spacer layer portion (SP-1) and a second spacer layer portion (SP-2). First spacer layer portion SP-1 is formed adjacent sensing layer structure 1624 (which is located above it), and second spacer layer portion SP-2 is formed adjacent pinned layer structure 1604 (which is located below it). In this embodiment, current-constraining structure 1680 has a single lithographically-defined conductive via 1582 surrounded by insulator materials 1642 and 1644 and is located in a center of the structure. However, any suitable number of preferably equally-distributed vias may be incorporated within current-constraining structure 1680 as will be shown and described later in relation to FIGS. 17 and 18.

Width $W_{13}$ of lithographically-defined conductive via 1582 may be defined relative to a trackwidth $TW_{S16}$ of CPP read sensor 1600. Preferably, width $W_{13}$ of lithographically-defined conductive via 1582 is less than or equal to ½ of a trackwidth $TW_{S16}$ of CPP read sensor 1600. In this embodiment, the trackwidth $TW_{S16}$ is about 100 nm (with a range of 30 to 200 nm) and width $W_{13}$ is about 10 nm (with a range of 3 to 40 nm). FIG. 16 reveals more clearly that lithographically-defined conductive via 1582 is formed at a centerline $L_{C16}$ of the width of sensor stack structure 1602 and trackwidth $TW_{S16}$ of CPP read sensor 1600. For the single conductive via, note that a distance $D_{16}$ defines the width of each insulator material portion 1642 and 1644 where $W_{13}+(2*D_{16})=TW_{S16}$.

Figure 19:
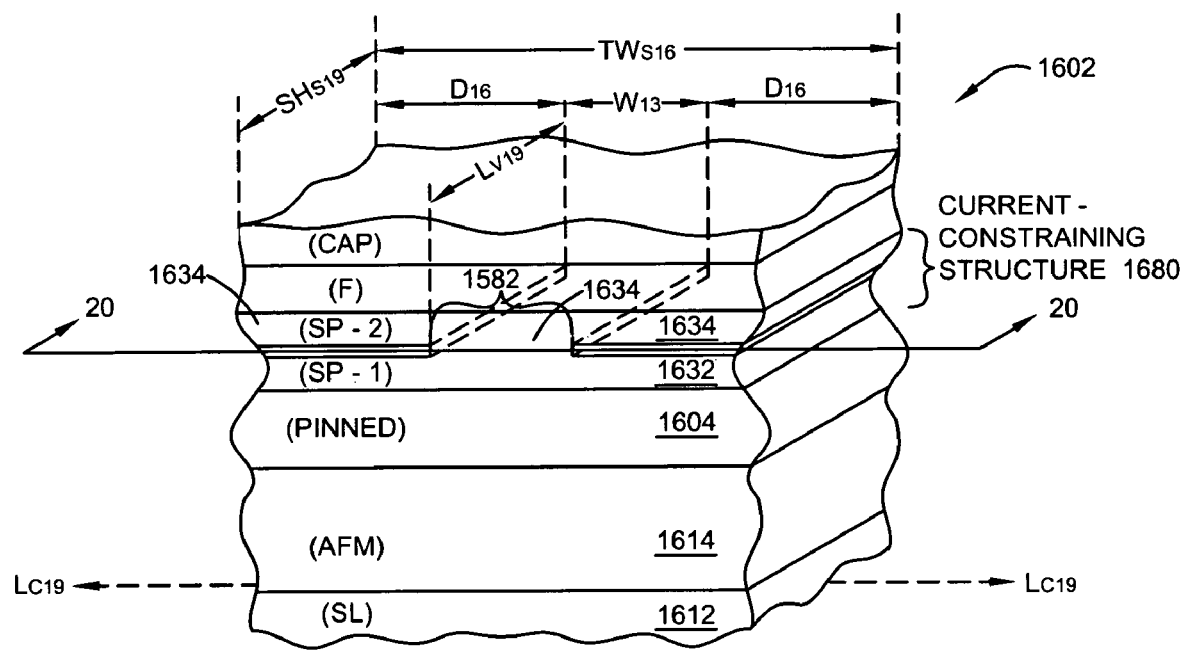
FIG. 19 is an isometric view of the CPP read sensor of the exemplary embodiment of FIG. 16, revealing exemplary trackwidth and stripe height dimensions of the lithographically-defined conductive via.
Figure 20:
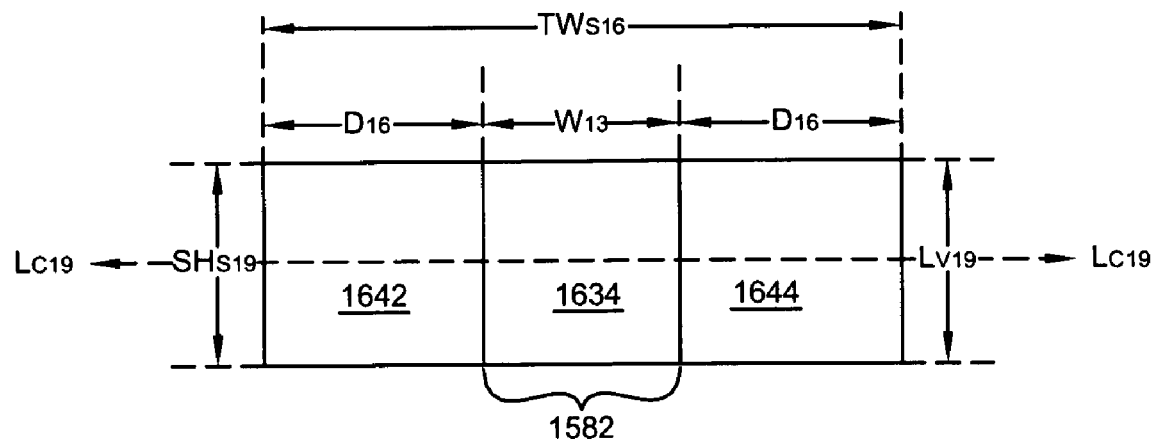
FIG. 20 is a top down view of the current-constraining structure of FIG. 16 and 19, revealing exemplary trackwidth and stripe height dimensions of the lithographically-defined conductive via.
Figure 21:
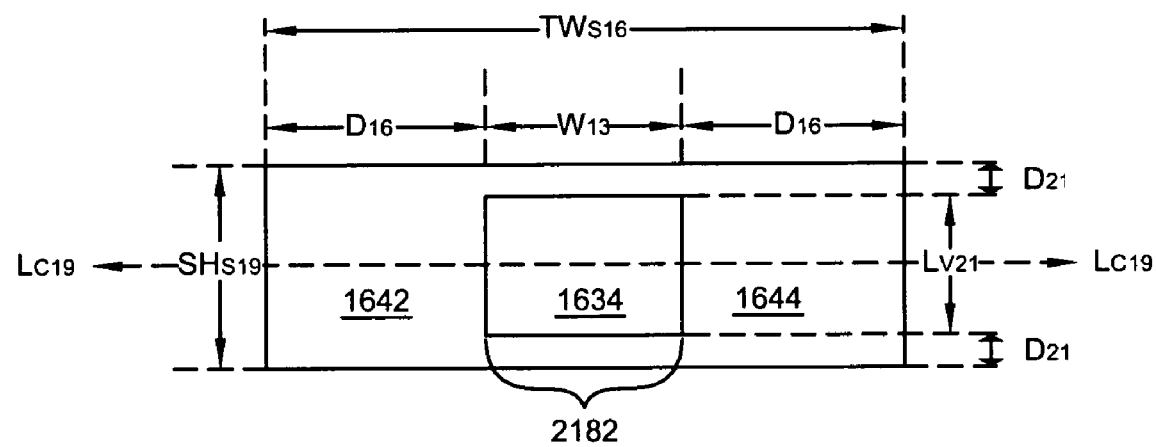
FIG. 21 is a top down view of one variation on the stripe height dimension of the lithographically-defined conductive via of FIGS. 16 and 19-20.

The dimension of lithographically-defined conductive via 1582 in the stripe height (SH) direction is now discussed in relation to FIGS. 19, 20, and 21. In FIG. 19, an isometric illustration of sensor stack structure 1602 is shown. As illustrated, sensor stack structure 1602 has a stripe height $SH_{S19}$ associated with it and lithographically-defined conductive via 1582 has a dimension $L_{V19}$ in the stripe height direction. In this embodiment, $L_{V19}=SH_{S19}$. More generally, dimension $L_{V19}$ is equal to or less than the stripe height $SH_{S19}$. A top down illustration taken along line 20-20 of FIGS. 16 and 19 is shown in FIG. 20, which reveals that lithographically-defined conductive via 1582 is formed at a centerline $L_{C19}$ of stripe height $SH_{S19}$ of sensor stack structure 1602. In FIG. 21, a top down illustration of a variation of this exemplary embodiment is shown. Again, a lithographically-defined conductive via 2182 has a dimension $L_{V21}$ in the stripe height direction. In the embodiment of FIG. 21, dimension $L_{V21}$ of lithographically-defined conductive via 2182 is less than the stripe height $SH_{S20}$. In this case, a distance $D_{21}$ defines the height of each insulator material portion where $L_{V21}+(2*D_{22})=SH_{S19}$. For the single conductive via embodiment, lithographically-defined conductive via 2182 is formed at a centerline $L_{C19}$ of stripe height $SH_{S19}$ of sensor stack structure 1602.

A CPP read sensor having current-constraining structure with one or more lithographically-defined conductive vias of the present application has advantages. Most importantly, the lithographically-defined conductive vias increase the current density of the read sensor in the region of the sensing layers to thereby simultaneously increase its resistance and magnetoresistance. Especially as the dimensions of read sensors are decreasing, a tighter control over the current density requirement of the read sensor may be achieved by design and during fabrication. The size and number of vias may be varied and selected so as to precisely "tune" the sensor's resistance and magnetoresistance. As there is increasing evidence that the magnetoresistive effect is reduced near edges of the read sensor from milling damage, it is also advantageous to isolate a single or few vias in the center of the sensor structure to avoid such damage.

Figure 17:
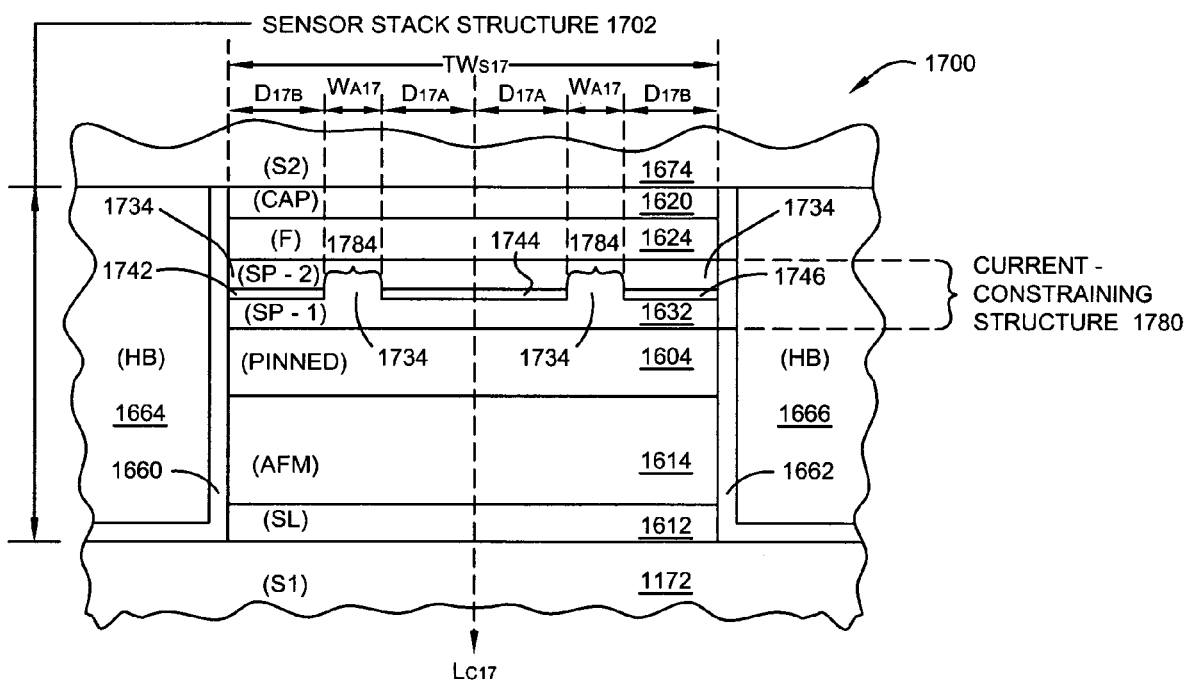
FIG. 17 is an ABS illustration showing a CPP read sensor of an alternative embodiment of the present application, which is the same as that shown in FIG. 16 except the current-constraining structure has two lithographically-defined conductive vias.

Referring now to FIG. 17, an alternate embodiment of a CPP read sensor 1700 of the present application is shown. FIG. 17 is the same as that shown and described in relation to FIG. 16 except for differences in a current-constraining structure 1780 of CPP read sensor 1700. In particular, current-constraining structure 1780 is formed with two lithographically-defined conductive vias 1782 and 1784 which are equally spaced apart from a centerline LC17 of a width of sensor stack structure 1702 and a trackwidth S17 of CPP read sensor 1700. Similar to FIG. 16, current-constraining structure 1780 is part of a spacer layer structure which has a first spacer layer portion (SP-1) and a second spacer layer portion (SP-2), where the second spacer layer portion SP-2 is formed adjacent sensing layer structure 1624 (which is positioned above it) and the first spacer layer portion SP-1 is formed adjacent pinned layer structure 1604 (which is positioned below it). Lithographically-defined conductive vias 1784 and 1784 have conductive materials 1734 formed within them, parts of which make up the spacer layer. Lithographically-defined conductive via 1782 is surrounded by insulator materials 1742 on the left and insulator materials 1744 on the right. Similarly, lithographically-defined conductive via 1784 is surrounded by insulator materials 1744 on the left and insulator materials 1746 on the right.

In this embodiment, each width $W_{A17}$ of lithographically-defined conductive vias 1782 and 1784 is chosen such that $(2*W_{A17})$ is less than or equal to ½ of a trackwidth $TW_{S17}$ of CPP read sensor 1700. Lithographically-defined conductive vias 1782 and 1784 are formed equally spaced apart from the centerline $L_{C17}$ of trackwidth $TW_{S17}$ of sensor stack structure 1702 by a distance $D_{17A}$ where $(2*W_{A17})+(2*D_{17A})+(2*D_{17B})=TW_{S17}$. Note that distance $D_{17B}$ may be equal to, less than, or greater than distance $D_{17A}$. As discussed in relation to FIGS. 20-22, lithographically-defined conductive vias 1782 and 1784 have stripe height dimensions as well which may vary.

A method for making such a structure of FIG. 17 is the same as that described earlier in relation to FIG. 10, except current-constraining structure 1780 is formed having the two lithographically-defined conductive vias 1782 and 1784. Here, the photoresist structure is formed with two openings (e.g. in FIGS. 12-13), etching is performed to create two apertures (e.g. in FIGS. 13-14), and deposition is performed within the two apertures (e.g. in FIGS. 14-15).

Figure 18:
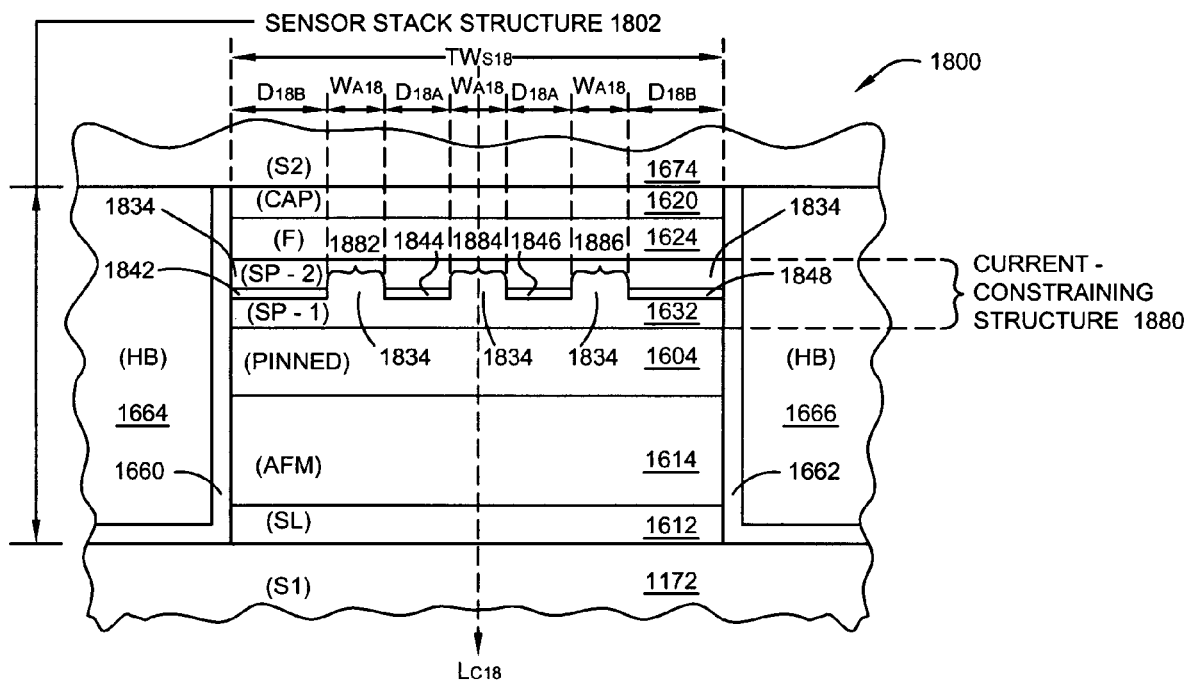
FIG. 18 is an ABS illustration showing a CPP read sensor of an alternative embodiment of the present application, which is the same as that shown in FIG. 16 except the current-constraining structure has three lithographically-defined conductive vias.

Referring ahead to FIG. 18, an alternate embodiment of a CPP read sensor 1800 of the present application is shown. FIG. 18 is the same as that shown in FIG. 16, except for differences in a current-constraining structure 1880 of CPP read sensor 1800. In particular, current-constraining structure 1780 is formed with three lithographically-defined conductive vias 1882, 1884, and 1886 which are equally spaced apart from a centerline $L_{C18}$ of a width of sensor stack structure 1702 and a trackwidth $TW_{S17}$ of CPP read sensor 1700 Similar to FIGS. 16-17, current-constraining structure 1880 is part of a spacer layer structure which has a first spacer layer portion (SP-1) and a second spacer layer portion (SP-2), where the second spacer layer portion SP-2 is formed adjacent sensing layer structure 1624 (which is located above it) and the first spacer layer portion SP-1 is formed adjacent pinned layer structure 1604. Lithographically-defined conductive vias 1882, 1884, and 1886 have conductive materials 1834 formed within them, parts of which make up the spacer layer structure. Lithographically-defined conductive via 1882 is surrounded by insulator materials 1842 on its left and insulator materials 1844 on its right. Similarly, lithographically-defined conductive via 1884 is surrounded by insulator materials 1844 on its left and insulator materials 1846 on its right. Also similarly, lithographically-defined conductive via 1886 is surrounded by insulator materials 1846 on its left and insulator materials 1848 on its right.

In this embodiment, each width $W_{A18}$ of lithographically-defined conductive vias 1882, 1884 and 1886 is chosen such that $(3*W_{A18})$ is less than or equal to ½ of a trackwidth $TW_{S18}$ of CPP magnetic head 1800. Lithographically-defined conductive via 1884 is formed at the centerline $L_{C18}$ of trackwidth $TW_{S18}$ of sensor stack structure 1802, whereas lithographically-defined conductive vias 1882 and 1886 are formed equally spaced apart from the centerline $L_{C18}$ by a distance $D_{18A}$ where $(3*W_{A18})+(2*D_{18A})+(2*D_{18B})=$trackwidth $TW_{S18}$. Note that distance $D_{18B}$ may be equal to, less than, or greater than distance $D_{18A}$. As discussed in relation to FIGS. 20-22, lithographically-defined conductive vias 1882, 1884 and 1886 have stripe height dimensions as well which may vary.

A method for making such a structure of FIG. 18 is the same as that described in relation to FIG. 10, except current-constraining structure 1880 is formed having the three lithographically-defined conductive vias 1884, 1884, and 1886. Here, the photoresist structure is formed with three openings (e.g. in FIGS. 12-13), etching is performed to create three apertures (e.g. in FIGS. 13-14), and deposition is performed within the three apertures (e.g. in FIGS. 14-15).

Figure 22:
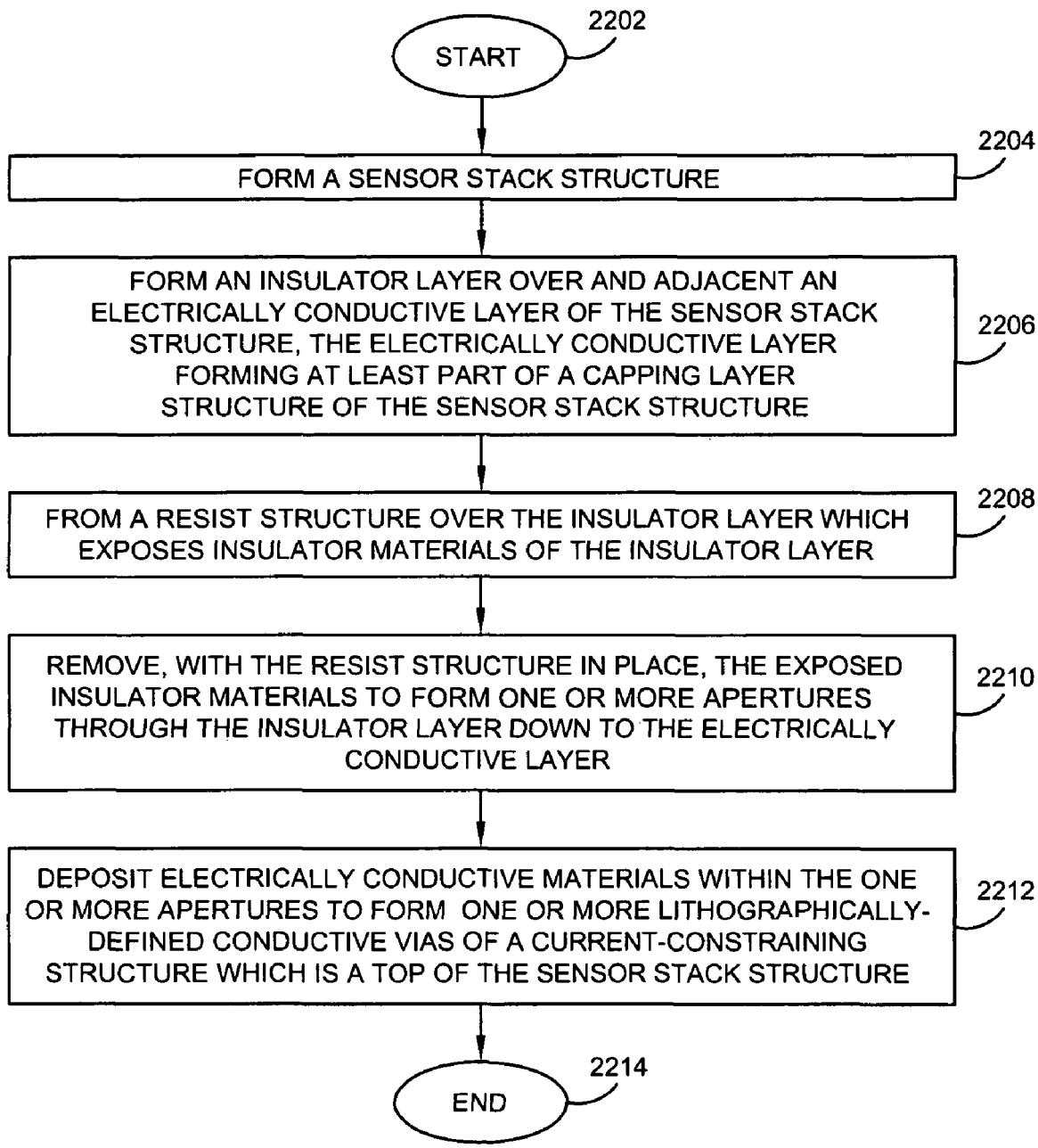
FIG. 22 is a flowchart which describes a fabrication process for a CPP sensor having a lithographically-defined conductive via formed at a top of a sensor stack structure.

FIG. 22 is a flowchart which describes a fabrication process for another exemplary CPP read sensor having a current-constraining structure made of one or more lithographically-defined conductive vias. FIGS. 23-27, which are a series of ABS illustrations showing partially-fabricated sensor structures corresponding to the steps described in the flowchart of FIG. 22, will be referred to in combination with the flowchart steps of FIG. 22.

Figure 23:
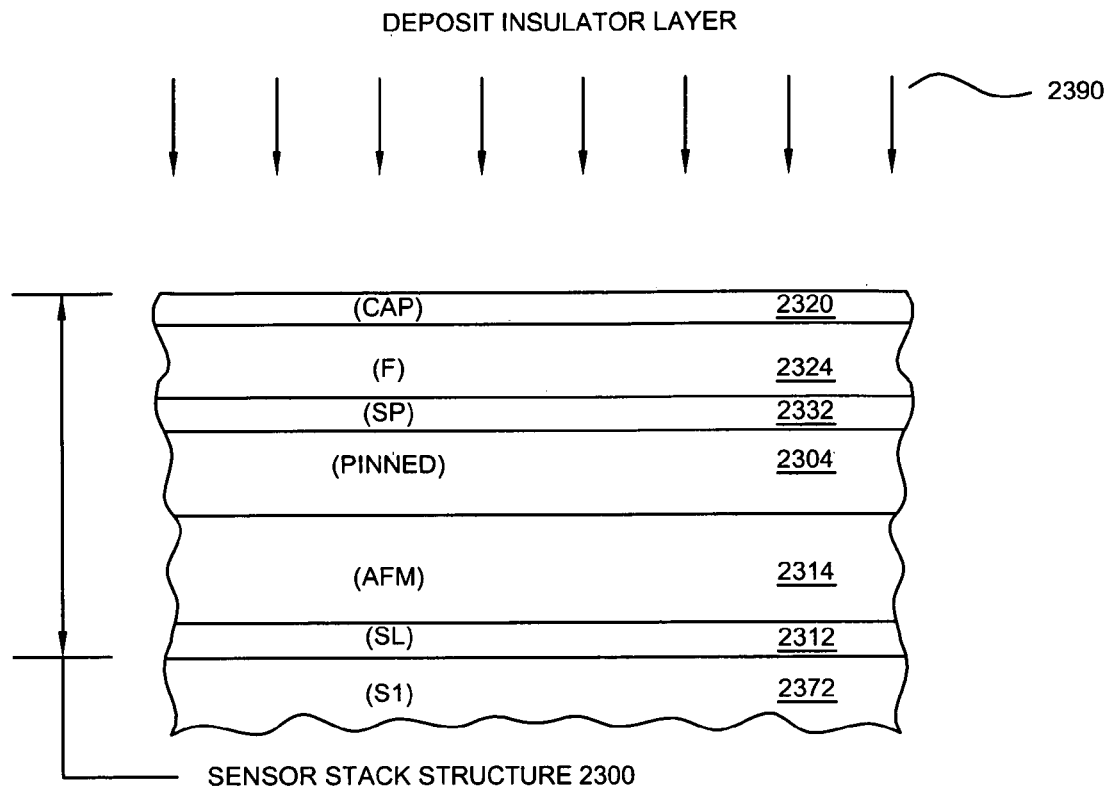
FIG. 23 is the first in a series of ABS illustrations of FIGS. 23-27 of partially fabricated sensor structures corresponding to the steps described in the flowchart of FIG. 22, showing that a read sensor stack structure which includes an electrically conductive layer capping layer is formed over a sensing layer structure.

Beginning at a start block 2202 of FIG. 22 in combination with FIG. 23, at least a portion of a CPP sensor stack structure 2300 is formed over a first shield layer (S1) 2372 (step 2204 of FIG. 22). CPP sensor stack structure 2300 has at least a portion of an electrically conductive capping layer structure (CAP) 2320. CPP sensor stack structure 2300 may be made of any suitable sensor materials and, in this embodiment, includes (from bottom to top) a seed layer (SL) 2312, an antiferromagnetic (AFM) pinning layer 2314, a pinned layer structure 2304, a spacer layer (SP) 2332, a sensing layer structure (F) 2324, and capping layer structure 2320. In this "top-SV" exemplary configuration, sensing layer structure 2324 is formed beneath and adjacent capping layer structure 2320 and over and adjacent spacer layer 2332. Pinned layer structure 2304 is formed beneath and adjacent spacer layer 2332 and over and adjacent AFM pinning layer 2314. AFM pinning layer 2314 is formed beneath and adjacent pinned layer structure 1104 and over and adjacent to seed layer 2312. Seed layer 2312 is formed over and adjacent first shield layer 2372 and underneath AFM pinning layer 2314 for promoting an improved texture of the layers deposited thereon.

In this embodiment, capping layer structure portion 2320 will form only a bottom portion or bottom sublayer of a top of the resulting CPP read sensor. Capping layer structure 2320 is highly-conductive and non-magnetic, and may be made of suitable materials such as tantalum (Ta).

Figure 24:
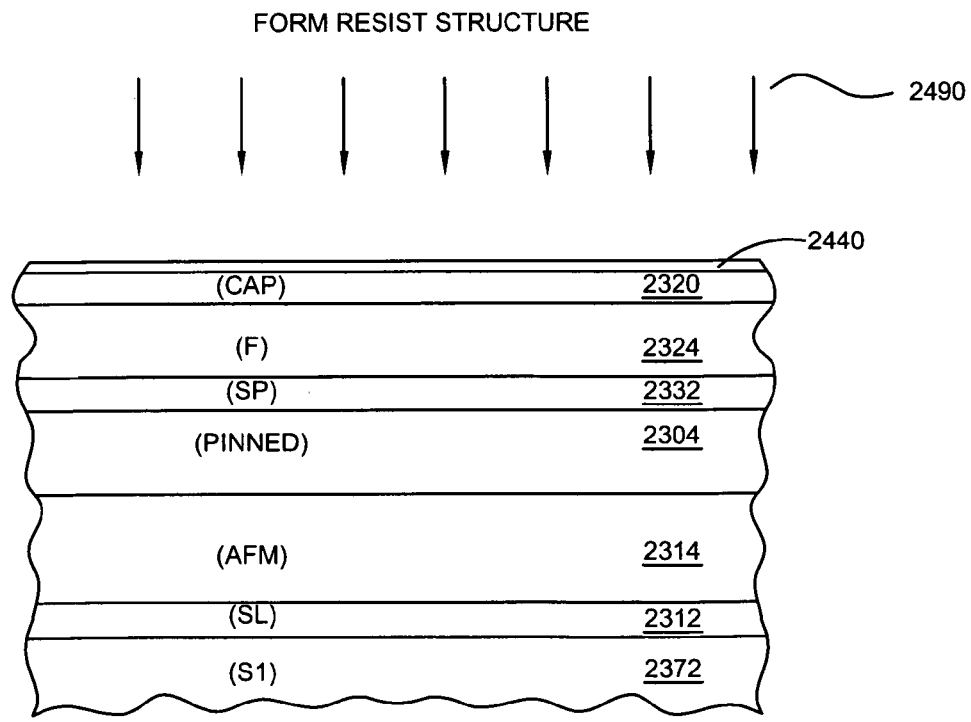
FIG. 24 is the second in a series of ABS illustrations of FIGS. 23-27 of partially fabricated sensor structures corresponding to the steps described in the flowchart of FIG. 22, which is the same as that shown in FIG. 23 except that an insulator layer is formed over the capping layer.

A deposition process 2390 is utilized to deposit insulator materials over and adjacent capping layer structure 2320 (step 2206 of FIG. 22). The result is shown in FIG. 24, where an insulator layer 2440 is formed in contact with capping layer structure 2320. Insulator layer 2440 may be made from any suitable electrically insulating material, such as $Al_2O_3$, or other insulator materials such as $SiO_2$, $Si_3N_4$, MgO, or $Ta_2O_5$. Insulator layer 2440 will form part of the top of the resulting sensor stack structure, and is formed with a thickness such as between 10 Å and 100 Å.

Figure 25:
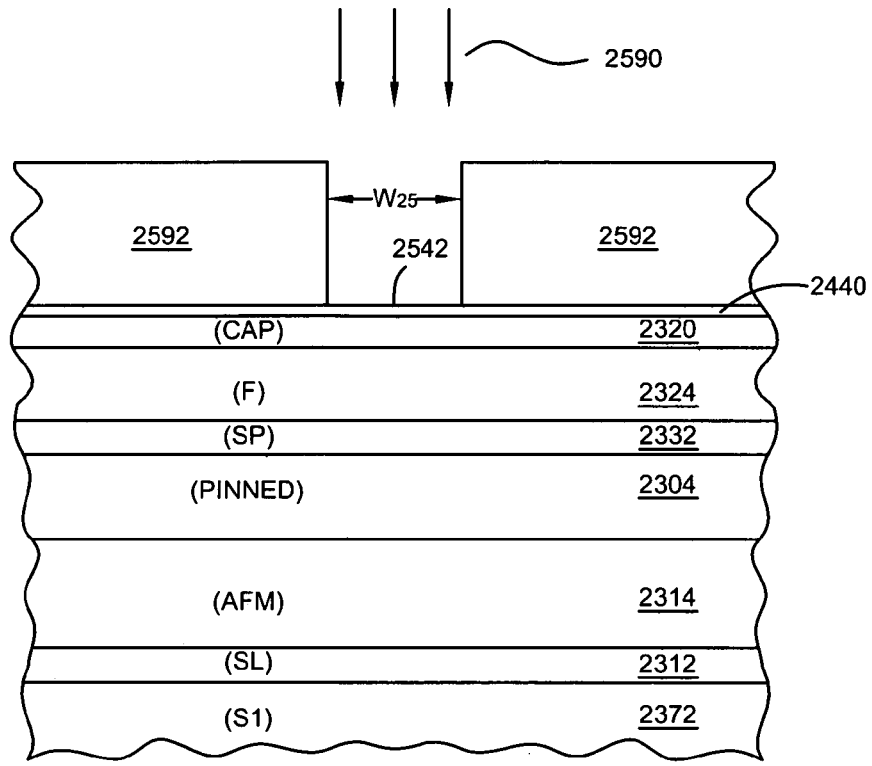
FIG. 25 is the third in a series of ABS illustrations of FIGS. 23-27 of partially fabricated sensor structures corresponding to the steps described in the flowchart of FIG. 22, which is the same as that shown in FIG. 24 except a resist structure is applied and patterned on top of the insulator layer exposing insulator materials of the insulator layer.

A resist structure formation process 2490 is then performed, where in FIG. 25 a resist structure 2592 is applied and patterned over and adjacent insulator layer 2440 exposing insulator materials 2542 of insulator layer 2440 (step 2208 of FIG. 22). Resist structure 2592 may be or include a photoresist. Alternatively, resist structure 2592 may be made from a resist which is compatible with electron beam (e-beam) lithography processes. Although resist structure 2592 is shown and described as a monolayer resist, it may alternatively be a multi-layered resist (e.g. bilayer or trilayer resist). If photolithography is used to form resist structure 2592, a thin film of resist is light-exposed in regions which are to be removed, provided the resist is a positive resist. If the resist is a negative resist, it is light-exposed in regions that are to be retained. Finally, the resist is subjected to a basic developer solution. If electron beam (e-beam) lithography is used to form resist structure 2592, a thin film of resist is e-beam-exposed in regions which are to be removed, provided the resist is a positive resist. If the resist is a negative resist, it is light-exposed in regions that are to be retained. Finally, the resist is subjected to a suitable developer solution. In this embodiment, only a single opening is formed within a center of resist structure 2592 (which is at a centerline of the width of sensor stack structure 2300 and the trackwidth of the resulting read sensor). However, the number of openings will vary depending on the number of vias desired.

As shown in FIG. 25, resist structure 2592 is formed to define an opening having an appropriate width $W_{25}$ for a subsequently-formed lithographically-defined conductive via. Width $W_{25}$, which will ultimately determine the width of the resulting conductive via, may be within 3 and 50 nanometers (nm).

Figure 26:
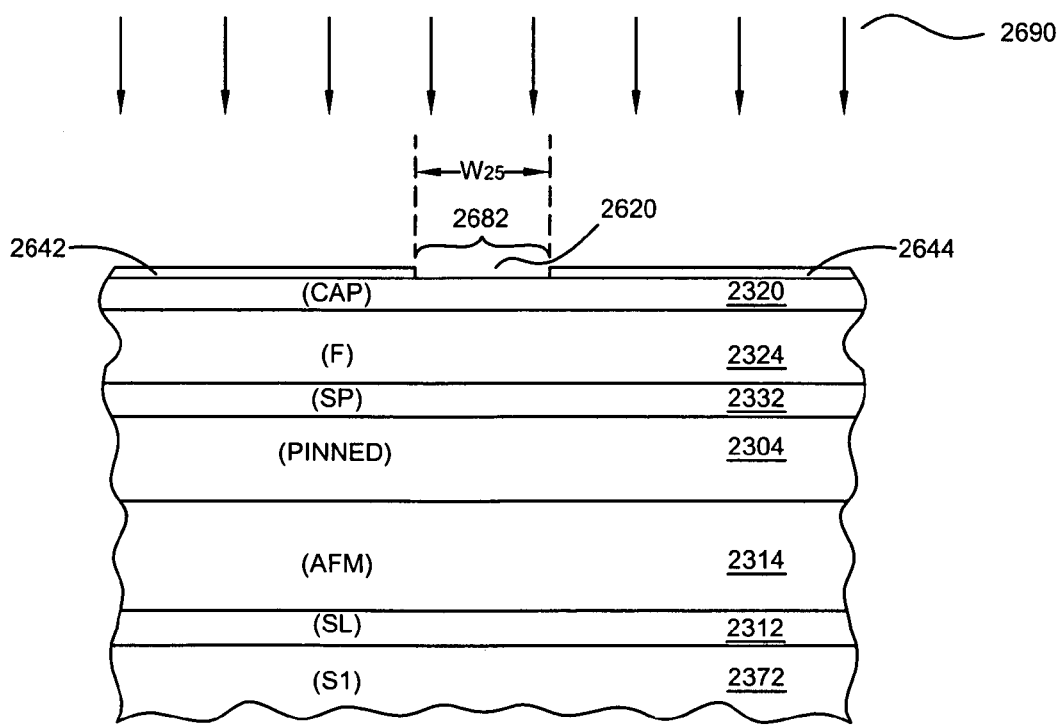
FIG. 26 is the fourth in a series of ABS illustrations of FIGS. 23-27 of partially fabricated sensor structures corresponding to the steps described in the flowchart of FIG. 22, which is the same as that shown in FIG. 25 except that the exposed insulator materials are removed and an aperture is formed through the insulator layer.

With resist structure 2592 in place, an etching process 2590 (e.g. ion milling) is utilized to remove exposed insulator materials 2540 through the opening of resist structure 2592 (step 2210 of FIG. 22). The result is shown in FIG. 26, where an aperture 2682 is formed down to the top of capping layer structure 2320 to expose electrically conductive materials 2620 thereof. If the etching is performed along the entire stripe height (SH) dimension, the insulator layer may be completely separated into first and second insulator layer portions 2642 and 2644. As shown the ion milling process is discontinued once the top of capping layer structure 2320 is reached, where electrically conductive materials 2620 of capping layer structure 2320 are exposed. Alternatively, the milling process may be continued to any desired depth into capping layer, but should be stopped before any damage to the free layer occurs. Thus, aperture 2682 is formed down through the entire insulator layer, is surrounded by insulator layer portions 2642 and 2644, and has substantially the same width $W_{25}$ as the opening of the resist structure. FIG. 26 also reveals that the resist structure may be removed at this time using a suitable solvent or other suitable technique.

Figure 27:
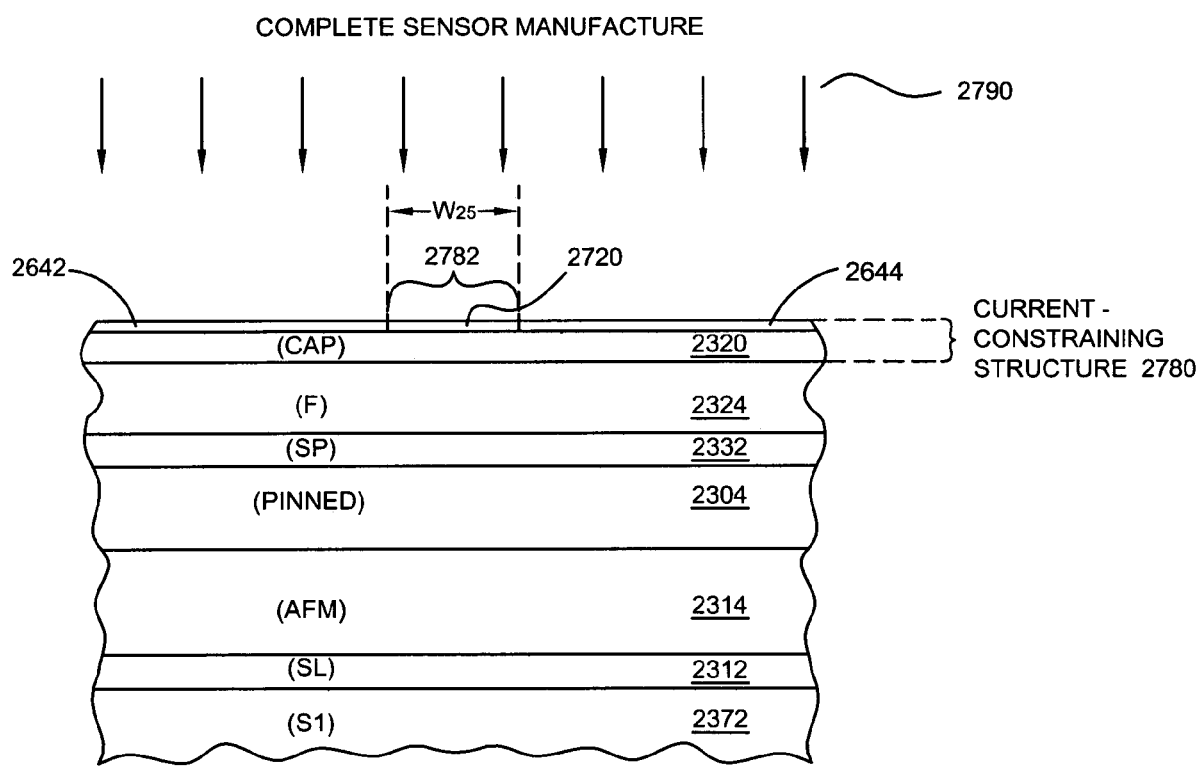
FIG. 27 is the fifth in a series of ABS illustrations of FIGS. 23-27 of partially fabricated sensor structures corresponding to the steps described in the flowchart of FIG. 22, which is the same as that shown in FIG. 26 except electrically conductive materials are formed within the via aperture over the insulator layer to thereby form a current-constraining structure having a lithographically-defined conductive via.

A deposition process 2690 is then performed to deposit electrically conductive materials within aperture 2682 over exposed electrically conductive materials 2620 (step 2212 of FIG. 22). The result is shown in FIG. 27, where electrically conductive materials 2720 are only formed within aperture 2682. As a result, a lithographically-defined conductive via 2782 of a current-constraining structure 2780 is formed. Electrically conductive materials 2720 are formed within lithographically-defined conductive via 2782 and form a top portion or top sublayer of the entire capping layer structure. As apparent, current-constraining structure 2780 is formed as a part of and a top of the sensor stack structure. In this embodiment, only a single via is formed within a center of the structure (which is at a centerline of the width of sensor stack structure 2300 and the trackwidth of the resulting read sensor). However, the number of vias and location will vary depending on the design.

Alternatively, electrically conductive materials may not only be formed within aperture 2682 but also over insulator layer portions 2642 and 2644. In this case, deposition process 2690 of FIG. 26 may alternatively be performed with resist structure 2592 kept in place until aperture 2632 is filled with the electrically conductive materials to form a flat top surface with insulator portions 2642 and 2644. After aperture is filled with the electrically conductive materials to form the via, resist structure 2592 is removed and the remaining electrically conductive materials are deposited to form the top sublayer of the capping layer structure.

The method corresponding to the steps described in the flowchart of FIG. 22 ends at an end block 2214, but additional processing steps may be subsequently performed. For example, additional manufacturing processes 2790 are utilized to complete the formation of the CPP read sensor, shown in FIG. 28 as a CPP read sensor 2800. These processes 2790 may utilize any suitable techniques known in the art (conventional or otherwise) to complete the manufacturing per the design requirements.

As described, the preferred lithographic process utilized in the method of FIG. 22 included the steps of forming a resist structure over an insulator layer of the sensor stack structure which exposes insulator materials of the insulator layer; etching, with the resist structure in place, the exposed insulator materials to form an aperture through the insulator layer; and forming electrically conductive materials within the aperture to thereby form the lithographically-defined conductive via. As an alternative, however, an electrically conductive layer may be etched and insulator materials may be subsequently deposited around it to form the via. This alternative lithographic process may include the more detailed steps of forming a resist structure over the electrically conductive layer which exposes electrically conductive materials of the electrically conductive layer; etching away, with the resist structure in place, the exposed electrically conductive materials to form openings through the conductive layer; and depositing insulator materials within the openings to surround the lithographically-defined conductive via.

As yet another alternative, an oxygenation process may be used on the capping layer to help produce the current-constraining structure of the present application. In this case, a lithographic process is used to form one or more apertures through the capping layer. Next, an oxygenation process follows on the capping layer materials to produce electrically insulative materials. Then, electrically conductive materials may be deposited within the apertures to form the lithographically-defined conductive vias.

Figure 28:
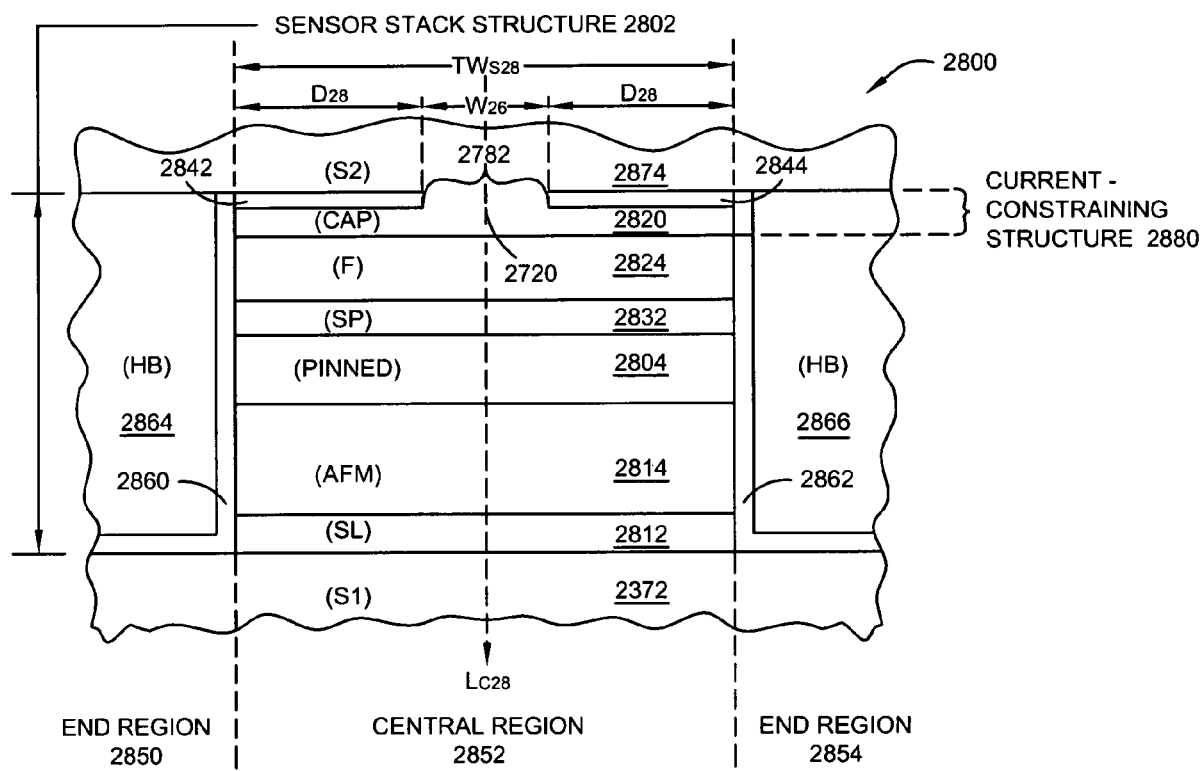
FIG. 28 is an ABS illustration showing a CPP read sensor of the exemplary embodiment of the present application.

As shown in FIG. 28, the resulting CPP read sensor 2800 made from the above-described methods has a sensor stack structure 2802 ("top-SV") formed in a central region 2852 surrounded by end regions 2850 and 2854. Sensor stack structure 2802 includes, from bottom to top, a seed layer 2812, an AFM pinning layer 2814, a pinned layer structure 2804, a spacer layer 2832, a sensing layer structure 2824 and a current-constraining structure 2820. Current-constraining structure 2880, comprising capping layer sublayer 2820, insulator portions 2842 and 2844, and electrically conductive materials 2720, is part of and forms a top of sensor stack structure 2802. Current-constraining structure 2880 is formed below and adjacent second shield layer 2874 and over and adjacent sensing layer structure 2824.

Sensing layer structure 2824 is formed below and adjacent current-constraining structure 2880 and over and adjacent spacer layer 2832. Spacer layer 2832 is formed below and adjacent sensing layer structure 2824 and above and adjacent pinned layer structure 2804. Pinned layer structure 2804 is formed below and adjacent spacer layer 2832 and over and adjacent AFM pinning layer 2814. AFM pinning layer 2814 is formed below and adjacent pinned layer structure 2804 and over and adjacent seed layer 2820. Seed layer 2812 is formed over and adjacent first shield layer 2372 and below and adjacent AFM pinning layer 2814 for promoting an improved texture of the layers deposited thereon. CPP read sensor 2800 has first and second insulator layers 2860 and 2862 formed in end regions 2850 and 2852 over and adjacent first shield layer 2372, as well as, sidewalls of sensor stack structure 2802. Furthermore, CPP read sensor 2800 has first and second hard bias layers 2864 and 2866 formed over and adjacent insulator layers 2860 and 2862. Finally, second shield layer (S2) 2874 is shown formed over the planarized structure.

The following materials may be utilized in CPP read sensor 2800. First and second shields 2372 and 2874 may be made of any suitable material such as NiFe; seed layer 2812 may have one or more layers of any suitable material such as NiFeCr or NiFe; AFM pinning layer structure 2814 may be made of any suitable material, such as PtMn or alternatively IrMn; pinned layer structure 2804 may be made of any suitable material such as Co or CoFe; spacer layer 2832 may be made of any suitable electrically conductive, non-magnetic material such as Cu or Au; sensing layer structure 2824 may be made of any suitable material such as CoFe or alternatively NiFe; electrically conductive portions 2820 and 2720 of current-constraining structure 2880 may be made of any suitable material such as Ta, while insulating portions 2842 and 2844 of current-constraining structure 2880 may be made of any suitable material such as $Al_2O_3$; first and second insulator layers 2860 and 2862 may be made of any suitable material such as $Al_2O_3$; first and second hard bias layers 2864 and 2866 may be made of any suitable material such as Co—Pt—Cr or other Co-based alloy.

The following thicknesses of the various layers may be utilized in CPP read sensor 2800. First and second shields 2372 and 2874 may have a thickness range of about 30 nm to about 500 nm; seed layer 2812 may have a thickness range of about 10 Å to about 100 Å; AFM pinning layer structure 2814 may have a thickness range of about 30 Å to about 300 Å; pinned layer structure 2804 may have a thickness range of about 10 Å to about 100 Å; spacer layer 2832 may have a thickness range of about 5 Å to about 20 Å; sensing layer structure 2824 may have a thickness range of about 10 Å to about 100 Å; electrically conductive portions 2820 and 2720 of current-constraining structure 2880 may have a thickness range of about 5 Å to about 50 Å respectively, insulating portions 2842 and 2844 of current-constraining structure 2880 may have a thickness range of about 5 Å to about 50 Å, and lithographically-defined conductive via 2782 may have a thickness range of about 5 Å to about 50 Å; first and second insulator layers 2860 and 2862 may have a thickness range of about 10 Å to about 100 Å; and first and second hard bias layers 2864 and 2866 may have a thickness range of about 20 nm to about 200 nm.

As shown in FIG. 28, current-constraining structure 2880 of this exemplary embodiment is formed as part of or within a capping layer structure having electrically conductive portions (e.g. capping layer) 2820 and 2720 and insulating portions 2842 and 2844. Electrically conductive portion 2820 is formed adjacent sensing layer structure 2824 (which is located below it), and electrically conductive portion 2720 and insulating portions 2842 and 2844 are formed adjacent second shield layer 2874 (which is located above it). In this embodiment, current-constraining structure 2880 has a single lithographically-defined conductive via 2782 surrounded by insulator materials 2842 and 2844 and is located in a center of the structure.

Width $W_{25}$ of lithographically-defined conductive via 2782 may be defined relative to a trackwidth $TW_{S28}$ of CPP read sensor 2800. Preferably, width $W_{25}$ of lithographically-defined conductive via 2782 is less than or equal to ½ of a trackwidth $TW_{S28}$ of CPP read sensor 2800. In this embodiment, the trackwidth $TW_{S28}$ is about 100 nm (with a range of 30 to 200 nm) and width $W_{25}$ is about 10 nm (with a range of 3 to 50 nm). FIG. 28 reveals more clearly that lithographically-defined conductive via 2782 is formed at a centerline $C_{C28}$ of the width of sensor stack structure 2802 and trackwidth $TW_{S28}$ of CPP read sensor 2800. For the single conductive via, note that a distance $D_{28}$ defines the width of each insulator material portion 2842 and 2844 where $W_{25}+(2*D_{28})=TW_{S28}$.

Note that, any suitable number of preferably equally-distributed vias may be incorporated within current-constraining structure 2880 as was shown and described previously in relation to current-constraining structures 1780 and 1880 of FIGS. 17 and 18. In addition, the discussions relating to the dimensions of lithographically-defined conductive via 1582 in the stripe height (SH) direction in FIGS. 19, 20, and 21, also applies to the dimensions of lithographically-defined conductive via 2782 in the SH direction.

A CPP read sensor having a current-constraining structure with one or more lithographically-defined conductive vias of the present application has advantages. Most importantly, the lithographically-defined conductive vias increase the current density of the read sensor in the region of the sensing layers to thereby simultaneously increase its resistance and magnetoresistance. Especially as the dimensions of read sensors are decreasing, a tighter control over the current density requirement of the read sensor may be achieved by design and during fabrication. The size and number of vias may be varied and selected so as to precisely "tune" the sensor's resistance and magnetoresistance. As the magnetoresistive effect may be reduced near edges of the read sensor due to milling damage, it is also advantageous to isolate a single or few vias in the center of the sensor stack structure to avoid such damage.

The CPP sensors of the present application may include all layers shown and described in relation to FIGS. 16-19. However, one skilled in the art understands the layers described in relation to FIGS. 16-19 and 28 are but a few examples of all possible CPP sensor layer configurations. For example, the CPP sensors are shown as top-type CPP sensors; however the sensors may be bottom-type CPP sensors. Alternative configurations may include dual CPP sensors, in-stack biasing structures, AP-pinned layer structures, and AP-sensing layer structures, to name a few.

Further structural variations may also be made. As described above, the current-constraining structure may be formed adjacent the sensing layer structure, or within or adjacent the capping layer structure. Alternatively, the current-constraining structure may be formed adjacent the pinned layer structure or the AFM pinning layer structure. Also described above, the lithographically-defined conductive via may be formed within the spacer layer. Alternatively, however, the lithographically-conductive via may be formed on top of or below the spacer layer, or on top of or below the capping layer.

Particular attention in the description was placed on the relative location of the lithographically-defined conductive vias. Specifically, the above embodiments describe the location of the lithographically-defined conductive vias at or equally spaced apart from the centerline of the trackwidth of the sensor stack structure and/or the centerline of the stripe height of the sensor stack structure. Alternatively, the lithographically-defined conductive vias of the present application may be formed in any suitable location for proper current flow, as in adjacent the ABS. Furthermore, as discussed specifically in relation to FIG. 22, a current-constraining structure of the present application may have lithographically-defined conductive vias with dimensions in the stripe height direction that are less than that of the stripe height. However, other configurations are possible. For example, a two-dimensional matrix (as viewed from top-down) of lithographically-defined conductive vias may be formed within the current constraining structure. In addition, multiple current-constraining structures of the present application may be utilized per the desires of the user.

As described herein, a CPP read sensor of the present application has a constrained current path. In an illustrative embodiment, the CPP read sensor includes a sensor stack structure; and a current-constraining structure of the sensor stack structure formed adjacent an electrically conductive layer of the sensor stack structure, where the current-constraining structure has a lithographically-defined conductive via surrounded by insulator materials. A CPP read sensor having a current-constraining structure with such a lithographically-defined conductive via has advantages over existing sensors. Most importantly, the lithographically-defined conductive vias increase the current density specifically within the active region of the read sensor to thereby increase its overall resistance and magnetoresistance. Especially as dimensions of read sensors are always decreasing, a tighter control over the current density requirement of the read sensor may be achieved by design and during fabrication. The size and number of vias may be varied and selected so as to precisely "tune" the sensor's resistance and magnetoresistance. As there is increasing evidence that the magnetoresistive effect is reduced near edges of the read sensor from milling damage, it is also advantageous to isolate a single or few vias in the center of the sensor structure to avoid such damage.

A magnetic head of the present application includes first and second shield layers; and a CPP read sensor formed between the first and the second shield layers. The CPP read sensor includes a sensor stack structure; a current-constraining structure of the senor stack formed adjacent an electrically conductive layer of the sensor stack structure, where the current-constraining structure has a lithographically-defined conductive via surrounded by insulator materials. A disk drive of the present application may include a housing; a magnetic disk rotatably supported in the housing; a magnetic head; a support mounted in the housing for supporting the magnetic head so as to be in a transducing relationship with the magnetic disk; a spindle motor for rotating the magnetic disk; an actuator positioning means connected to the support for moving the magnetic head to multiple positions with respect to said magnetic disk; a processor connected to the magnetic head assembly, to the spindle motor, and to the actuator for exchanging signals with the magnetic head for controlling movement of the magnetic disk and for controlling the position of the magnetic head; the magnetic head assembly including a read head having a CPP sensor as described above.

A method of making a CPP read sensor having a constrained current path includes the steps of forming at least part of a sensor stack structure and performing a lithographic process to form a current-constraining structure adjacent an electrically conducting layer of the sensor stack structure, where the current-constraining structure comprising a lithographically-defined conductive via surrounded by insulator materials. The lithographic process may include the steps of forming a resist structure over an insulator layer of the sensor stack structure which exposes insulator materials of the insulator layer; etching, with the resist structure in place, to remove the exposed insulator materials to thereby form an aperture through the insulator layer; and forming electrically conductive materials within the aperture to thereby form the lithographically-defined conductive via. Alternatively, the lithographic process may include the steps of forming a resist structure over the electrically conductive layer which exposes electrically conductive materials of the electrically conductive layer; etching, with the resist structure in place, to remove the exposed electrically conductive materials to thereby form openings through the conductive layer; and forming insulator materials within the openings to surround the lithographically-defined conductive via.

Again as described above, the CPP read sensor may have a sensor stack structure and a current-constraining structure formed adjacent an electrically conductive layer of the sensor stack structure, where the current-constraining structure has a lithographically-defined conductive via surrounded by insulator materials. However, the CPP read sensor may have other various attributes. As an example, the lithographically-defined conductive via of the current-constraining structure may have a width that is less than or equal to ½ of a width of the sensor stack structure. Also for example, the lithographically-defined conductive via may be formed within the electrically conductive layer. Alternatively, the lithographically-defined conductive via may be formed over and in contact with the electrically conductive layer. Also alternatively, the lithographically-defined conductive via may be formed below the electrically conductive layer. The lithographically-defined conductive via may be formed at a centerline of a trackwidth of the sensor stack structure. Note further that the current-constraining structure may have a plurality of lithographically-defined conductive vias formed equally spaced apart from a centerline of a trackwidth of the sensor stack structure. The electrically conductive layer may comprise a spacer layer formed adjacent a sensing layer structure of the sensor stack structure. Alternatively, the electrically conductive layer may comprise a capping layer formed adjacent a sensing layer structure of the sensor stack structure. Further, the current-constraining structure may comprise a plurality of the lithographically-defined conductive vias formed equally spaced apart from a centerline of a stripe height of the sensor stack structure. In one embodiment, the electrically conductive layer is at least part of a spacer layer formed between a sensing layer and a pinning layer of the sensor stack structure, and the lithographically-defined conductive via is a single lithographically-defined conductive via of the current-constraining structure formed at a centerline of a width of the sensor stack structure.

In one specific embodiment of the present application, the CPP read sensor includes a sensor stack structure; and a current-constraining structure of the sensor stack structure formed as a top of the sensor stack structure, where the current-constraining structure has a lithographically-defined conductive via surrounded by insulator materials. A magnetic head of the specific embodiment includes first and second shield layers; and a CPP read sensor formed between the first and the second shield layers. The CPP read sensor includes a sensor stack structure; a current-constraining structure of the sensor stack formed as a top of the sensor stack structure, where the current-constraining structure has a lithographically-defined conductive via surrounded by insulator materials. This specific CPP sensor may have some of the other various attributes described above. Further, for this specific CPP sensor, a bottom width of the lithographically-defined conductive via may be less than or equal to a top width of the lithographically-defined conductive via.

A disk drive of the specific embodiment may include a housing; a magnetic disk rotatably supported in the housing; a magnetic head; a support mounted in the housing for supporting the magnetic head so as to be in a transducing relationship with the magnetic disk; a spindle motor for rotating the magnetic disk; an actuator positioning means connected to the support for moving the magnetic head to multiple positions with respect to said magnetic disk; a processor connected to the magnetic head assembly, to the spindle motor, and to the actuator for exchanging signals with the magnetic head for controlling movement of the magnetic disk and for controlling the position of the magnetic head; the magnetic head assembly including a read head having a CPP sensor as described above.

As described herein, a method of making a CPP read sensor having a constrained current path of the specific embodiment includes the steps of forming at least part of a sensor stack structure and performing a lithographic process to form a current-constraining structure as a top of the sensor stack structure, where the current-constraining structure comprising a lithographically-defined conductive via is surrounded by insulator materials. The lithographic process may include the steps of forming a resist structure over an insulator layer of the sensor stack structure which exposes insulator materials of the insulator layer; etching, with the resist structure in place, to remove the exposed insulator materials to thereby form an aperture through the insulator layer; and forming electrically conductive materials within the aperture to thereby form the lithographically-defined conductive via. Alternatively, the lithographic process may include the steps of forming a resist structure over at least a portion of an electrically conductive layer (e.g. capping layer) of the sensor stack structure which exposes electrically conductive materials of the electrically conductive layer; etching, with the resist structure in place, to remove the exposed electrically conductive materials to thereby form openings through the conductive layer; and forming insulator materials within the openings to surround the lithographically-defined conductive via.

A preferred method of making the CPP of the specific embodiment includes the steps of forming at least part of a sensor stack structure of the read sensor; forming an insulator layer over and adjacent an electrically conductive layer of the sensor stack structure, the electrically conductive layer forming at least part of a capping layer of the sensor stack structure; forming a resist structure over the insulator layer which exposes insulator materials of the insulator layer; etching, with the resist structure in place, to remove the exposed insulator materials to thereby form one or more apertures through the insulator layer down to the electrically conductive layer; and forming electrically conductive materials within the one or more apertures to form one or more lithographically-defined conductive vias of a current-constraining structure which is a top of the sensor stack structure.

It is to be understood that the above is merely a description of preferred embodiments of the invention and that various changes, alterations, and variations may be made without departing from the true spirit and scope of the invention as set for in the appended claims. Few if any of the terms or phrases in the specification and claims have been given any special meaning different from their plain language meaning, and therefore the specification is not to be used to define terms in an unduly narrow sense.

What is claimed is:

1. A method of making a current-perpendicular-to-plane (CPP) read sensor having a constrained current path, the method comprising the acts of:
    forming a sensor stack structure;
    performing a lithographic process to form a current-constraining structure adjacent an electrically conductive layer of the sensor stack structure, the current-constraining structure comprising a plurality of lithographically-defined conductive vias surrounded by insulator materials, the lithographic process comprising the further acts of:
        forming an insulator layer over the electrically conductive layer;
        forming a resist structure over the insulator layer which exposes insulator materials of the insulator layer;
        etching, with the resist structure in place, to remove the exposed insulator materials to form a plurality of apertures to the electrically conductive layer; and
        forming electrically conductive materials within the plurality of apertures for forming the lithographically-defined conductive vias, each lithographically-defined conductive via having a width that is less than a trackwidth of the read sensor to be formed from the sensor stack structure and is located within boundaries defined by the trackwidth of the read sensor.

2. The method of claim 1, wherein the width of each of the lithographically-defined conductive vias is less than or equal to ½ of the trackwidth of the read sensor.

3. The method of claim 1, wherein the step of performing the lithographic process comprises the further step of performing a photolithography process.

4. The method of claim 1, wherein the step of performing the lithographic process comprises the further step of performing an electron beam (e-beam) lithography process.

5. The method of claim 1, wherein the lithographically-defined conductive vias are formed below the electrically conductive layer.

6. A method of making a current-perpendicular-to-plane (CPP) read sensor having a constrained current path, the method comprising the acts of:
- forming a sensor stack structure;
- performing a lithographic process to form a current-constraining structure adjacent an electrically conductive layer of the sensor stack structure, the current-constraining structure comprising a lithographically-defined conductive via surrounded by insulator materials, the lithographic process comprising the further acts of:
  - forming an insulator layer over the electrically conductive layer;
  - forming a resist structure over the insulator layer which exposes insulator materials of the insulator layer;
  - etching, with the resist structure in place, to remove the exposed insulator materials to form an aperture to the electrically conductive layer; and
  - forming electrically conductive materials within the aperture for forming the lithographically-defined conductive via, which has a width that is less than or equal to ½ of a trackwidth of the read sensor to be formed from the sensor stack structure and is located within boundaries defined by the trackwidth of the read sensor.

7. The method of claim 6, further comprising:
- wherein the act of performing the lithographic process comprises the further act of performing the lithographic process to form the current constraining structure with a plurality of lithographically-defined conductive vias surrounded by the insulator materials;
- wherein the act of etching to remove the exposed insulator materials comprises forming a plurality of apertures to the electrically conductive layer; and
- wherein the act of forming electrically conductive materials further comprises forming the electrically conductive materials with the plurality of apertures to thereby form the plurality of lithographically-defined conductive vias, each lithographically-defined conductive via located within the boundaries defined by the trackwidth of the read sensor.

8. The method of claim 6, wherein the act of forming the current-constraining structure comprises forming the current-constraining structure where the lithographically-defined via is only a single lithographically-defined conductive via.

9. The method of claim 6, wherein the step of performing the lithographic process comprises the further step of performing a photolithography process.

10. The method of claim 6, wherein the step of performing the lithographic process comprises the further step of performing an electron beam (e-beam) lithography process.

11. The method of claim 6, wherein the lithographically-defined conductive via is formed below the electrically conductive layer.

* * * * *